US 9,978,619 B2

(12) United States Patent
Yamaoka et al.

(10) Patent No.: US 9,978,619 B2
(45) Date of Patent: May 22, 2018

(54) SUBSTRATE PROCESSING APPARATUS, SUBSTRATE PROCESSING METHOD AND STORAGE MEDIUM

(71) Applicant: TOKYO ELECTRON LIMITED, Tokyo (JP)

(72) Inventors: Terutaka Yamaoka, Koshi (JP); Naoki Tajima, Koshi (JP); Koji Motoi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/064,810

(22) Filed: Mar. 9, 2016

(65) Prior Publication Data

US 2016/0274469 A1    Sep. 22, 2016

(30) Foreign Application Priority Data

Mar. 19, 2015 (JP) ................................. 2015-056467

(51) Int. Cl.
*G03B 27/32* (2006.01)
*G03D 5/00* (2006.01)
(Continued)

(52) U.S. Cl.
CPC ...... *H01L 21/67196* (2013.01); *G03F 7/7075* (2013.01); *H01L 21/67173* (2013.01); *H01L 21/67178* (2013.01); *H01L 21/67703* (2013.01)

(58) Field of Classification Search
CPC ............ G03F 7/7075; H01L 21/67173; H01L 21/67178; H01L 21/67196; H01L 21/67703
(Continued)

(56) References Cited

U.S. PATENT DOCUMENTS

2006/0201615 A1* 9/2006 Matsuoka ......... H01L 21/67178
156/272.2
2008/0014333 A1* 1/2008 Matsuoka ......... H01L 21/67178
427/8
(Continued)

FOREIGN PATENT DOCUMENTS

JP    2007-150071 A    6/2007
JP    2008-258208 A    10/2008
(Continued)

*Primary Examiner* — Colin Kreutzer
(74) *Attorney, Agent, or Firm* — Nath, Goldberg & Meyer; Jerald L. Meyer

(57) ABSTRACT

A substrate processing apparatus includes a carrier block, an end block for returning a substrate picked up from the carrier block to the carrier block, and a middle block. The middle block includes a plurality of first processing modules stacked one above another, each being configured to process the picked-up substrate and directed to the end block or the substrate returning from the end block to the carrier block; a first transfer mechanism for vertically moving to transfer the substrate that is transferred from one of the carrier and end blocks to the middle block, to a respective one of the first processing modules, and delivering the substrate to the other of the carrier and end blocks; and a second transfer mechanism for transferring the substrate from the other of the carrier and end blocks to the one thereof, without passing through the plurality of first processing modules.

12 Claims, 17 Drawing Sheets

(51) Int. Cl.
  *H01L 21/67* (2006.01)
  *G03F 7/20* (2006.01)
  *H01L 21/677* (2006.01)

(58) Field of Classification Search
  USPC .......................................... 355/27; 396/611
  See application file for complete search history.

(56) References Cited

U.S. PATENT DOCUMENTS

| | | | | |
|---|---|---|---|---|
| 2008/0129968 A1* | 6/2008 | Hayashida | ............ | G03F 7/3021 355/27 |
| 2008/0268383 A1* | 10/2008 | Matsuoka | ......... | H01L 21/67028 430/324 |
| 2009/0003825 A1* | 1/2009 | Ueda | ................ | H01L 21/67769 396/647 |
| 2009/0098298 A1* | 4/2009 | Miyata | .............. | H01L 21/67276 427/372.2 |
| 2010/0321648 A1* | 12/2010 | Nakaharada | ........... | G03B 27/52 355/27 |
| 2011/0078898 A1* | 4/2011 | Ishida | ............... | H01L 21/67051 29/771 |
| 2011/0103923 A1* | 5/2011 | Minamida | ......... | H01L 21/67196 414/222.01 |
| 2011/0297085 A1* | 12/2011 | Matsuyama | .............. | G03F 7/20 118/695 |
| 2013/0202386 A1* | 8/2013 | Matsuyama | ...... | H01L 21/67712 414/161 |
| 2013/0236838 A1* | 9/2013 | Matsuyama | ........ | H01L 21/6715 430/325 |

FOREIGN PATENT DOCUMENTS

| | | |
|---|---|---|
| JP | 2009-231624 A | 10/2009 |
| JP | 2012-19130 A | 1/2012 |
| JP | 2012-39165 | 2/2012 |

* cited by examiner

FIG. 6
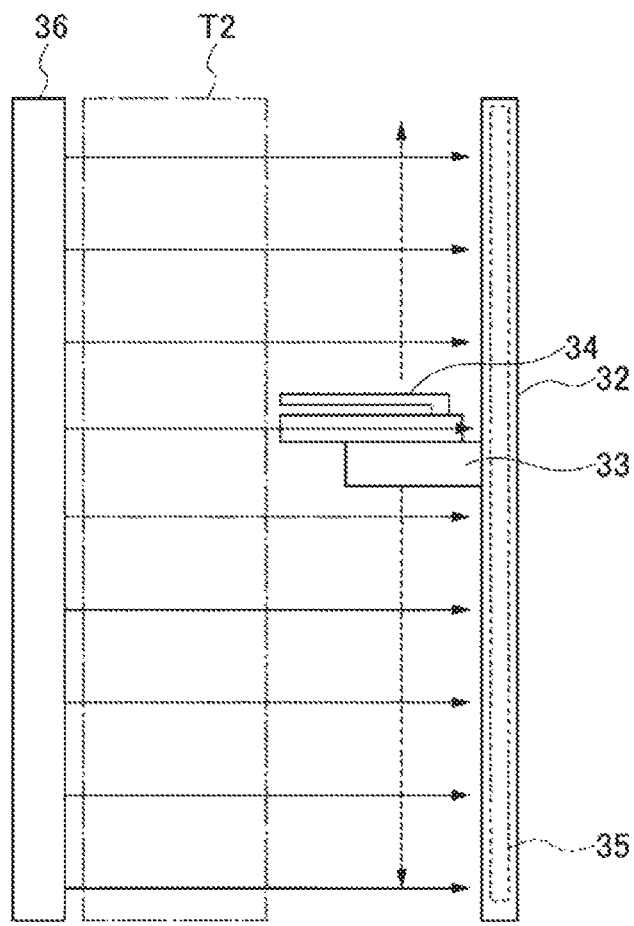
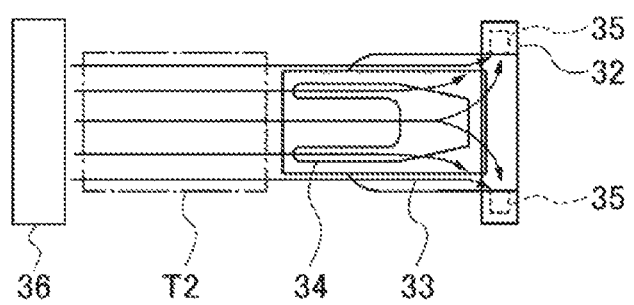

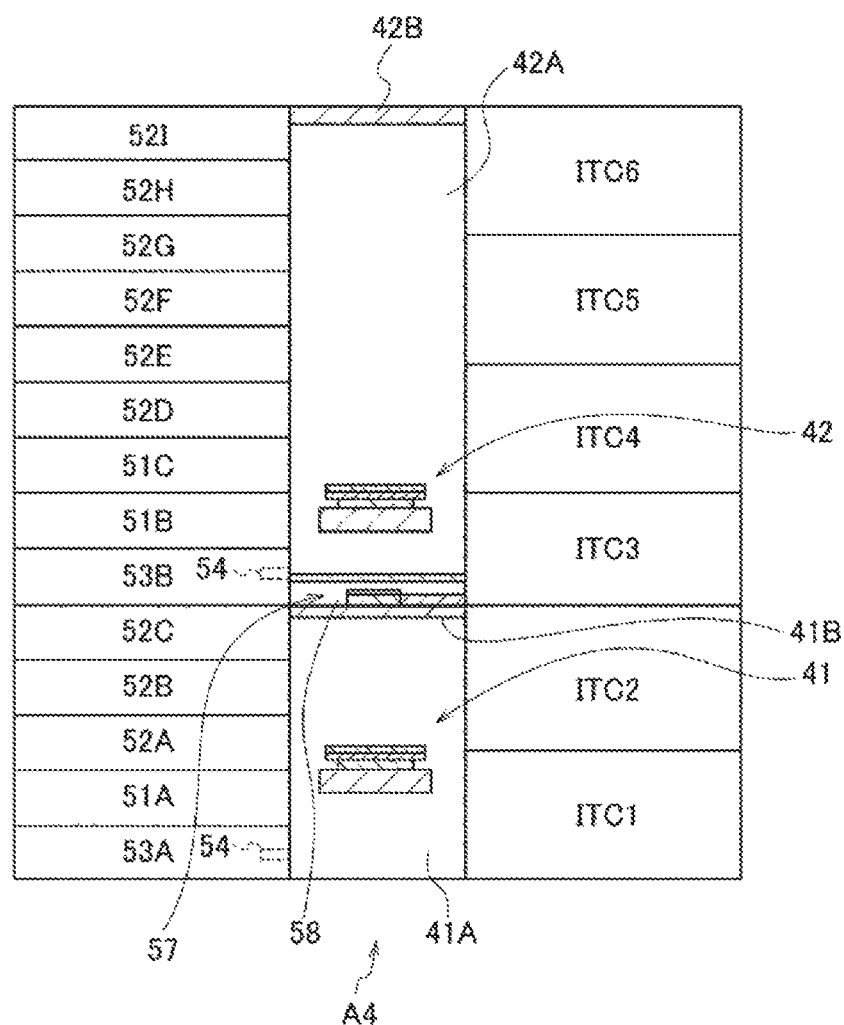

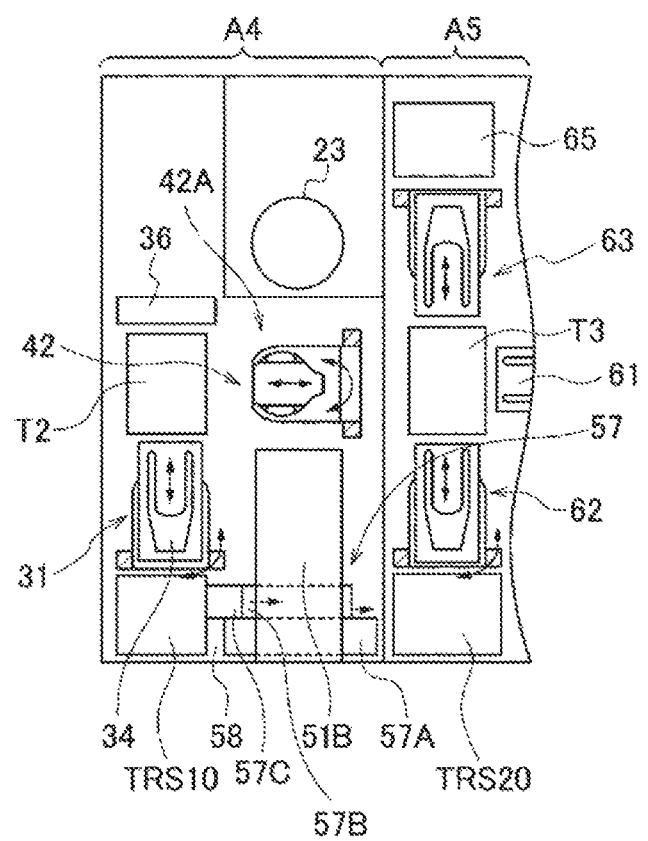

SUBSTRATE PROCESSING APPARATUS, SUBSTRATE PROCESSING METHOD AND STORAGE MEDIUM

CROSS-REFERENCE TO RELATED APPLICATION

This application claims the benefit of Japanese Patent Application No. 2015-056467, filed on Mar. 19, 2015, in the Japan Patent Office, the disclosure of which is incorporated herein in its entirety by reference.

TECHNICAL FIELD

The present disclosure relates to a substrate processing apparatus including a plurality of processing modules stacked one above another to process a substrate, a substrate processing method thereof, and a storage medium.

BACKGROUND

In a photolithography of a semiconductor device manufacturing process, a resist pattern is formed on a semiconductor wafer (hereinafter, referred to as a "wafer") as a substrate using a resist pattern forming system including a coating/developing apparatus and an exposing apparatus which are connected to each other. The coating/developing apparatus includes liquid treatment modules which supply various kinds of chemical liquids, for example, a resist coating module which coats a resist on the wafer to form a resist film on the wafer, a developing module which supplies a developing solution onto the resist film exposed by the exposing apparatus to form a resist pattern, and a protective film forming module which supplies a chemical liquid onto the wafer to form a protective film for protecting the resist film when the wafer is exposed by the exposing apparatus, and the like. The coating/developing apparatus also includes a heating module which performs a heat treatment on the wafer before and after respective liquid treatments. An example of such a coating/developing apparatus is known.

In recent years, throughput of the exposing apparatus becomes increasingly higher. Thus, improvement of throughput of the coating/developing apparatus requires enhancing productivity of the resist pattern forming system. Specifically, the coating/developing apparatus is required to process, for example, about 275 sheets of wafers per hour. To do this, increasing the number of modules which perform the same type of treatments on the wafer and performing respective treatments on the wafer in these modules in parallel may be considered.

As an example, there is known a coating/developing apparatus provided with a front processing block and a rear processing block which are sequentially arranged to face an exposing apparatus. Each of the front and rear processing blocks includes unit blocks which are vertically partitioned in multiple-stages. Each of the unit blocks includes a processing module, a heating module, and a transfer mechanism for transferring a wafer between these modules. Such an arrangement facilities installation of various types of additional modules. In the rear processing block, a protective film forming module is installed in a lower one of the unit blocks, and a rear surface cleaning module which cleans a rear surface of the wafer before exposure is installed in an upper unit block. Together with the protective film forming module and the rear surface cleaning module, two cups for processing wafers received therein are arranged along the direction in which the front and rear processing blocks are arranged.

In such a coating/developing apparatus, a wafer (wafer after exposure) which has been subjected to an exposure treatment by the exposing apparatus passes through the rear processing block, and then is transferred to the front processing block where the wafer is subjected to respective treatments. As described above, when the protective film forming module and the rear surface cleaning module are installed in the rear processing block, a transfer mechanism installed in each of the unit blocks of the rear processing block is sometimes required to transfer the wafer after exposure in the course of transferring a wafer before exposure to a respective module. This increases a load borne by the transfer mechanism, which makes it difficult to sufficiently enhance throughput.

Meanwhile, the rear surface cleaning module may be installed in an interface block which interconnects between the rear processing block and the exposing apparatus. However, if the rear surface cleaning module is installed in the interface block, an occupied floor area (footprint) of a subsequent stage of the processing block is relatively large with respect to the number of the cups installed in the rear processing block. Thus, the coating/developing apparatus is required to have an increased number of additional modules while suppressing the footprint. That is to say, there is a desire to provide an apparatus which is capable of suppressing extension of the footprint and achieving high throughput, compared to the conventional coating/developing apparatus.

SUMMARY

Some embodiments of the present disclosure provide a substrate processing device which is capable of suppressing an occupied floor area and achieving high throughput, a substrate processing method thereof, and a storage medium.

According to one embodiment of the present disclosure, there is provided a substrate processing apparatus including: a carrier block configured to pick up a substrate received in a carrier; an end block disposed in a horizontal direction with respect to the carrier block and configured to return the substrate picked up from the carrier block to the carrier block; and a middle block disposed between the carrier block and the end block, wherein the middle block includes: a plurality of first processing modules stacked one above another, each of which being configured to process the substrate picked up from the carrier block and directed to the end block or the substrate returning from the end block to the carrier block; a first substrate transfer mechanism configured to move up and down to transfer the substrate that is transferred from one of the carrier block and the end block to the middle block, to a respective one of the first processing modules, and to deliver the substrate to the other of the carrier block and the end block; and a second substrate transfer mechanism installed separately from the first substrate transfer mechanism and configured to transfer the substrate from the other of the carrier block and the end block to the one thereof, without passing through the plurality of first processing modules.

According to another embodiment of the present disclosure, there is provided a method for use in a substrate processing apparatus, the substrate processing apparatus including: a carrier block configured to pick up a substrate received in a carrier; an end block disposed in a horizontal direction with respect to the carrier block and configured to return the substrate picked up from the carrier block to the carrier block; and a middle block disposed between the carrier block and the end block, the method including: processing, by a plurality of processing modules stacked one above another and disposed in the middle block, the substrate picked up from the carrier block and directed to the end block or the substrate returning from the end block to the carrier block; delivering, by a first substrate transfer mechanism configured to move up and down, the substrate that is transferred from one of the carrier block and the end block to the middle block, to a respective one of the first processing modules, and delivering the substrate to the other of the carrier block and the end block; and transferring, by a second substrate transfer mechanism installed separately from the first substrate transfer mechanism, the substrate from the other of the carrier block and the end block to the one, without passing through the plurality of processing modules.

According to yet another embodiment of the present disclosure, there is provided a non-transitory computer-readable storage medium storing a computer program used in a substrate processing apparatus, wherein the computer program causes a computer to execute the aforementioned substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a view showing an air flow formed in the middle block.

FIG. 16 is a schematic vertical sectional rear view showing another configuration of the middle block.

FIG. 17 is a plane view showing another configuration of the middle block.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Figure 1:
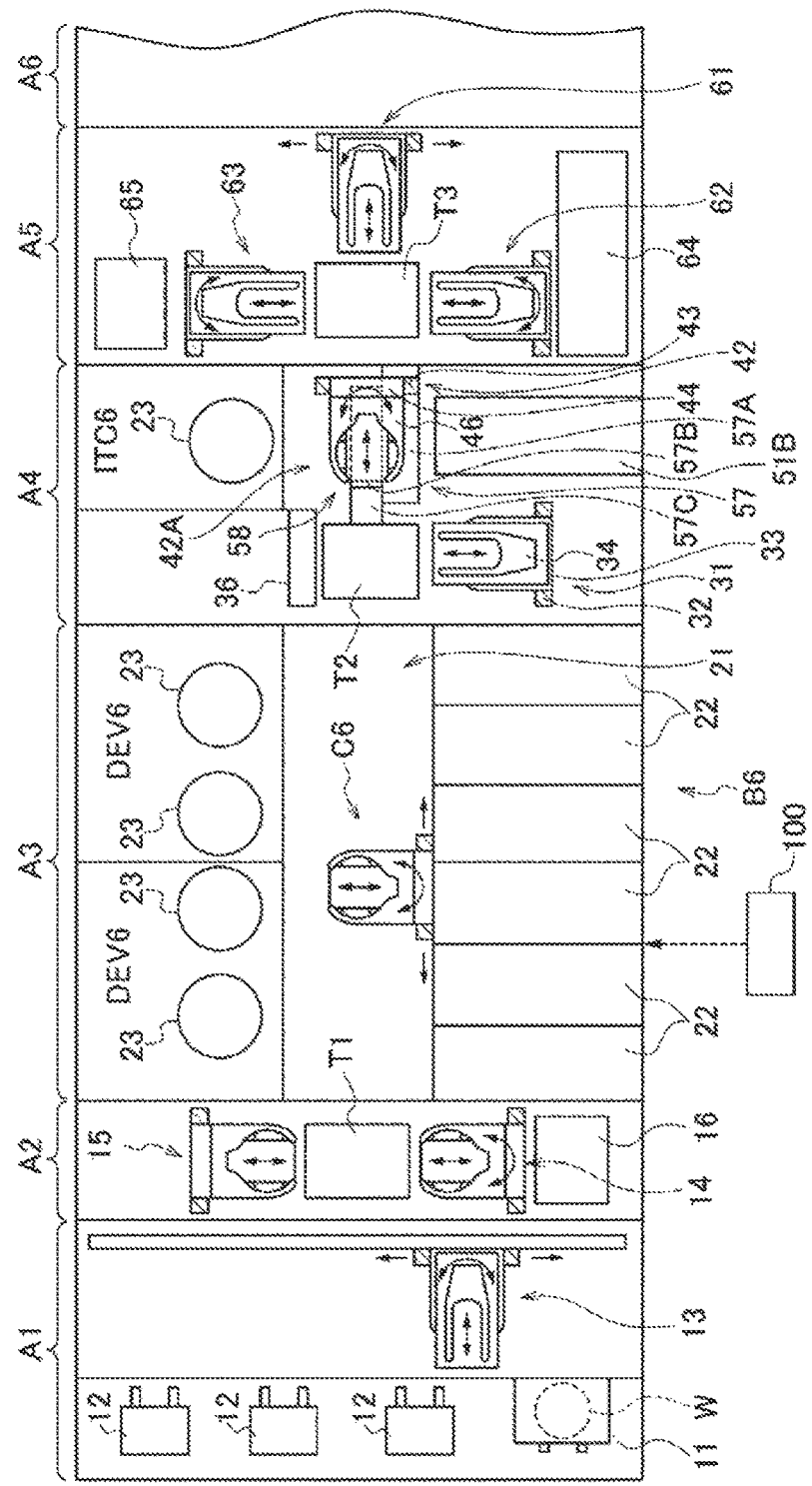
FIG. 1 is a plane view of a coating/developing apparatus according to a first embodiment of the present disclosure.
Figure 2:
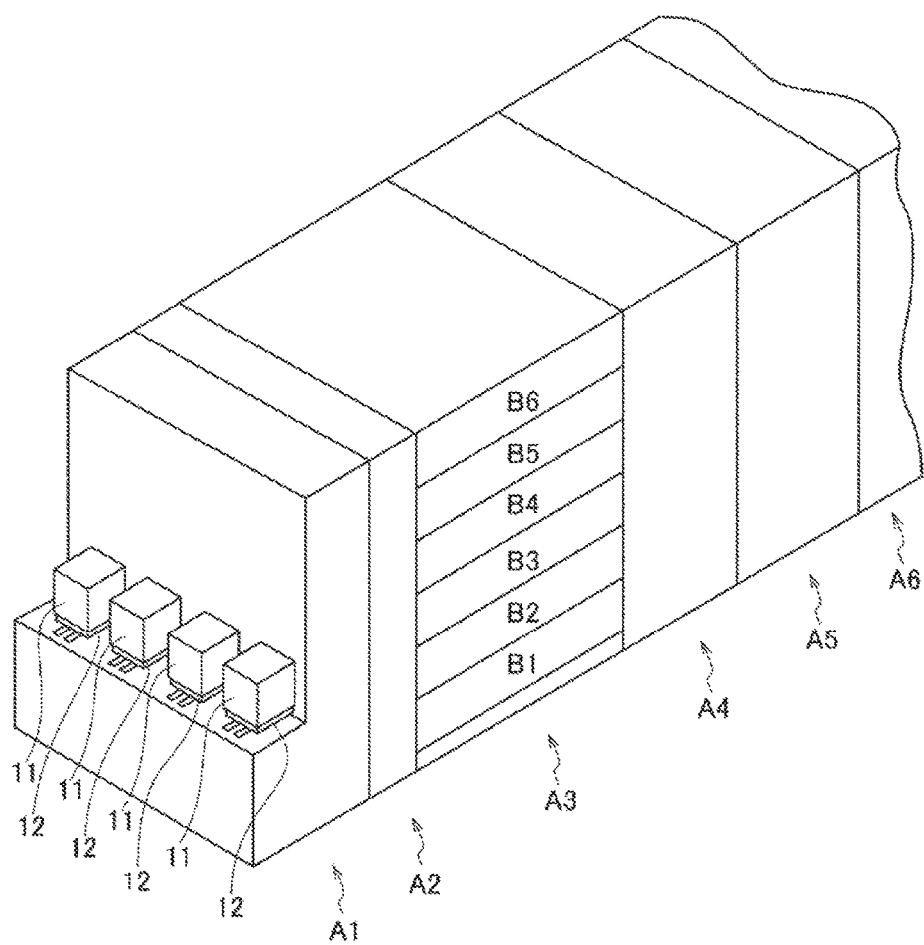
FIG. 2 is a perspective view of the coating/developing apparatus.
Figure 3:
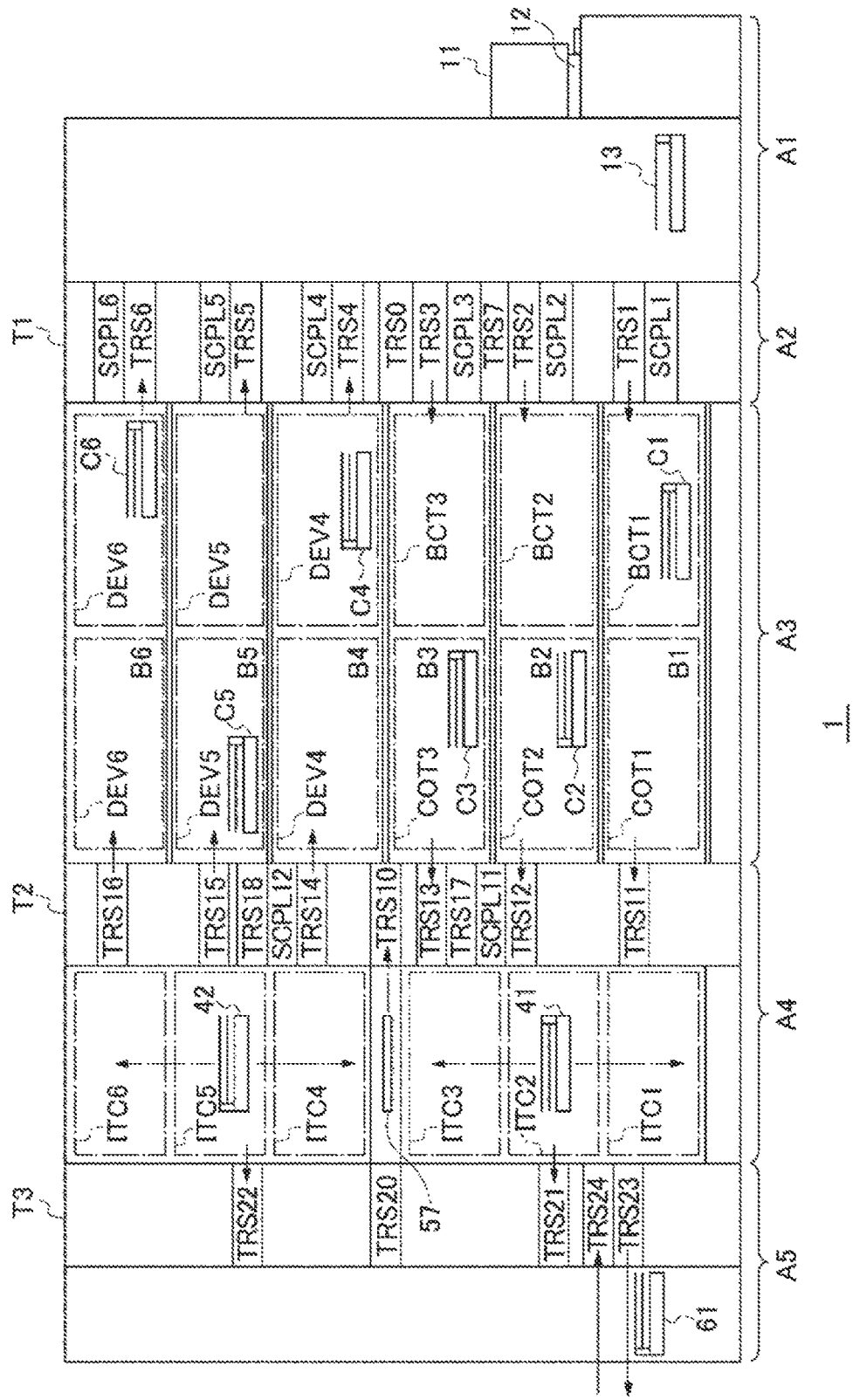
FIG. 3 is a schematic vertical sectional view of the coating/developing apparatus.

A coating/developing apparatus 1 used as a substrate processing device according to a first embodiment of the present disclosure will be described with reference to FIGS. 1 to 3. FIGS. 1 to 3 are a plane view, a perspective view, and a schematic vertical sectional view of the coating/developing apparatus 1, respectively. For example, an exposing apparatus A6 configured to perform a liquid immersion lithography is connected to the coating/developing apparatus 1. A combination of the coating/developing apparatus 1 and the exposing apparatus A6 constitutes a resist pattern forming system which forms a resist film on a surface of a wafer W as a substrate, exposes and develops the resist film in a sequential manner, thus forming a resist pattern on the resist film.

The coating/developing apparatus 1 includes a carrier block A1, a delivery block A2, a processing block A3, a middle block A4 and an interface block A5, which are linearly arranged in that order in a horizontal direction. The interface block A5 as an end block is connected to the exposing apparatus A6 at an opposite side of the side connected to the middle block A4. The blocks A1 to A5 are arranged adjacent to each other while being partitioned from each other. For the sake of description, the arrangement direction of the blocks A1 to A5 is referred to as an anteroposterior direction, a side in which the carrier block A1 is positioned is referred to as a front side, and a side in which the interface block A5 is positioned is referred to as a rear side.

In FIG. 1, a reference numeral 11 represents a carrier 11 having a plurality of the wafers W received therein, which is transferred into the coating/developing apparatus 1 from the outside. The carrier block A1 includes a mounting table 12 on which the carrier 11 is mounted and a transfer mechanism 13 configured to transfer the wafer W between the interior of the carrier 11 and the interior of the carrier block A1. The transfer mechanism 13 is configured to deliver the wafer W between the carrier 11 and respective delivery modules TRS of a tower T1 to be described later. In each embodiment, a place where the wafer W is mounted is referred to as a module.

Next, the delivery block A2 will be described. The tower T1 composed of modules is disposed in a central portion of the delivery block A2 in a left-right direction. The tower T1 includes a plurality of delivery modules TRS configured to deliver the wafer W between the delivery block A2 and the carrier block A1 or the processing block A3, and a plurality of temperature control modules SCPL configured to control a temperature of the wafer W, which are stacked on one another. Among the delivery modules TRS of the tower T1, ones where the delivery of the wafer W is performed by the transfer mechanism 13 are represented as TRS0 and TRS7 in FIG. 3. The arrangement of the other delivery modules TRS and the other temperature control modules SCPL in the tower T1 will be described later.

In the delivery block A2, transfer mechanisms 14 and 15 are disposed such that the tower T1 is placed therebetween in the left-right direction. When viewed from the front side to the rear side, the transfer mechanism 14 is disposed in the right side and the transfer mechanism 15 is disposed in the left side. The transfer mechanisms 14 and 15 are configured to move up and down so as to transfer the wafer W between respective modules constituting the tower T1. When viewed from the front side to the rear side, a hydrophobizing module 16 which is configured to supply gas onto the front surface of the wafer W to hydrophobize the surface, is disposed in the right side of the transfer mechanism 14. The transfer mechanism 14 is also configured to transfer the wafer W between the respective modules of the tower T1 and the hydrophobizing module 16.

Next, the processing block A3 will be described. The processing block A3 includes flat unit blocks B1 to B6 partitioned from each other, which are stacked one above another from below. The unit blocks B1 to B3 are to form an antireflection film and a resist film on the wafer W before being subjected to an exposure treatment by the exposing apparatus A6. The unit blocks B4 to B6 are to perform a development treatment on the wafer W after being subjected to the exposure treatment by the exposing apparatus A6.

The unit block B6 will be described with reference to FIG. 1. In FIG. 1, a reference numeral 21 represents a transfer area in which the wafer W is transferred. The transfer area is defined to extend in the anteroposterior direction in a central portion of the unit block B6 in the left-right direction. When viewed from the front side to the rear side, a plurality of heating modules 22 are arranged in the right side of the transfer area 21. The heating modules 22 are vertically stacked to form a stacked body. Six stacked bodies thus formed are arranged in the anteroposterior direction. Each of the heating modules 22 includes a heating plate on which the wafer W is mounted, such that the wafer W mounted on the heating plate is heated to a predetermined temperature.

When viewed from the front side to the rear side, two developing modules DEV6 are disposed in the left side of the transfer area 21 in the anteroposterior direction. Each of the developing modules DEV6 includes two cups 23 arranged in the anteroposterior direction. In each of the developing modules DEV6, a developing solution is supplied onto the wafers W received in the two cups 23 so that the development treatment is performed. A transfer mechanism C6 configured to transfer the wafer W is installed in the transfer area 21. The transfer mechanism C6 transfers the wafer W between the respective cups 23 of the developing modules DEV6, the heating modules 22, and respective modules positioned at a level corresponding to the unit block B6 among modules installed in the tower T1 and a tower T2 (which will be described later).

The unit blocks B4 and B5 are similar to the unit block B6 in configuration. In FIG. 3, developing modules disposed in the unit blocks B4 and B5 are represented as DEV4 and DEV5, respectively, and transfer mechanisms disposed in the unit blocks B4 and B5 are represented as C4 and C5, respectively. In each of the unit blocks B1 to B3, one resist film forming module COT and one antireflection film forming module BCT are installed instead of the two developing modules DEV. The resist film forming module COT and the antireflection film forming module BCT are substantially similar to the developing module DEV in configuration, while they supply a liquid chemical for forming the resist film and the antireflection film onto the wafers W received in the respective cups 23, instead of the developing solution, thus performing a coating treatment. As described above, the unit blocks B1 to B3 are similar to the unit blocks B4 to B6 in configuration, except that each of the unit blocks B1 to B3 is provided with the resist film forming module COT and the antireflection film forming module BCT, instead of the developing module DEV.

In FIG. 3, the resist film forming modules respectively disposed in the unit blocks B1 to B3 are represented as COT1 to COT3, and the antireflection film forming modules respectively disposed in the unit blocks B1 to B3 are represented as BCT1 to BCT3. Further, transfer mechanisms respectively disposed in the unit blocks B1 to B3 are represented as C1 to C3. The transfer mechanisms C1 to C6 constitutes a third substrate transfer mechanism. In the first embodiment, in each of the developing modules DEV4 to DEV6, the developing solution is supplied onto the wafer W so as to perform a development treatment (hereinafter, referred to as a "positive development treatment") for removing an exposed area in the resist film.

The arrangement of the modules of the tower T1 in the delivery block A2 will be now additionally described. The delivery modules TRS and the temperature control modules SCPL are arranged at respective levels where the wafers W can be delivered by the respective transfer mechanisms C1 to C6. In FIG. 3, the delivery modules TRS where the wafers W can be delivered by the respective transfer mechanisms C1 to C6 are represented as TRS1 to TRS6, and the temperature control modules SCPL where the wafers W can be delivered by the respective transfer mechanisms C1 to C6 are represented as SCPL1 to SCPL6.

Next, the middle block A4 will be described with reference to FIG. 4 (the perspective view) and FIG. 5 (the schematic vertical sectional rear view when viewed from the rear side to the front side). In the front side of the central portion of the middle block A4 in the left-right direction, the tower T2 composed of modules constituting a delivery part is disposed. The tower T2 includes a plurality of delivery modules TRS and a plurality of temperature control modules SCPL, which are vertically stacked one above another.

The delivery modules TRS of the tower T2 are disposed at levels corresponding to the unit blocks B1 to B6, respectively. Modules (a first mounting module) where the wafers W are respectively delivered by the transfer mechanisms C1 to C6, are represented as TRS11 to TRS16. Further, in a lower portion and an upper portion of the tower T2, delivery modules TRS17 and TRS18 are respectively disposed such that the wafers W can be respectively delivered by a lower transfer mechanism 41 and an upper transfer mechanism 42 to be described later. Further, in a central portion of the tower T2 in a height direction, a delivery module TRS10 as a second mounting module where the wafer W is delivered to a shuttle 57 to be described later, is disposed. Further, temperature control modules SCPL11 and SCPL12 are disposed in the lower portion and the upper portion of the tower T2, respectively. In the temperature control modules SCPL11 and SCPL12, the wafers W can be delivered by the lower transfer mechanism 41 and the upper transfer mechanism 42, respectively.

Configurations of the delivery modules TRS11 to TRS18 will be described. Each of the delivery modules TRS11 to TRS18 includes a horizontal plate and three pins protruding upward from the horizontal plate to support a central portion of a rear surface of the wafer W. The wafer W can be delivered to leading ends of the pins with elevation operations of the transfer mechanisms C1 to C6 of the processing block A3, the lower transfer mechanism 41, the upper transfer mechanism 42, and a vertical transfer mechanism 31, which will be described later. Further, delivery modules TRS except for the delivery modules in the tower T1 and a delivery module TRS20 in a tower T3 (which will be described later) are similar to, for example, the delivery modules TRS11 to TRS18 in configuration such that the wafer W can be delivered between the respective transfer mechanisms. The delivery module TRS10, which includes three elevating pins configured to move up and down by an elevating mechanism and support the central portion of the rear surface of the wafer W, is configured to deliver the wafer W between the shuttle 57 (which will be described later) and the elevating pins.

Each of the temperature control modules SCPL11 and SCPL12 includes a substantially circular plate on which the wafer W is mounted. A notch is formed in a peripheral portion of the plate. A hook portion of a support body 46 (which will be described later) of each of the lower transfer mechanism 41 and the upper transfer mechanism 42 passes through the notch so that the wafer W is delivered between the support body 46 and the plate. A rear surface of the plate has a cooling water path formed therein to control a temperature of the wafer W mounted on the plate. Further, the temperature control modules SCPL1 to SCPL6 of the tower T1 are configured similar to the temperature control modules SCPL11 and SCPL12.

The tower T2 is disposed between the vertical transfer mechanism 31 and a clean air supply part 36 in the left-right direction. The vertical transfer mechanism 31, which is configured to transfer the wafer W between the mounting modules, constitutes a first substrate transfer mechanism together with the lower transfer mechanism 41 and the upper transfer mechanism 42. The vertical transfer mechanism 31 will be described with reference to FIG. 6. An upper stage and a lower stage of FIG. 6 show a lateral side and a top side of the vertical transfer mechanism 31, respectively. The vertical transfer mechanism 31 includes an upwardly extending frame-like guide 32, an elevation station 33 configured to vertically move up and down in a longitudinal direction of the guide 32, and a support body 34 configured to move forward and backward on the elevation station 33 and support the rear surface of the wafer W. The support body 34 is formed in a substantially U-formation when viewed in a plane view so as to deliver the wafer W to the respective delivery modules TRS of the tower T2. Thus, the support body 34 supports the wafer W without interfering with the central portion of the rear surface of the wafer W. In the guide 32, a slit-like exhaust port 35 opened inward of the guide 32 is formed along the longitudinal direction of the guide 32.

The clean air supply part 36, which includes a filter, is formed in an elongated shape to supply air cleaned by the filter toward the tower T2 while covering from an upper end portion of the tower T2 up to a lower end portion thereof. In the course of transferring the wafer W in the coating/developing apparatus 1, the supply operation of the clean air by the clean air supply part 36 and the exhaust operation by the exhaust port 35 are performed in parallel. This configuration forms air flows which laterally travel to pass through between the respective modules of the tower T2 and to pass through an elevation area of the elevation station 33 of the vertical transfer mechanism 31 as indicated by a dashed arrow in the upper stage of FIG. 6. In the upper stage and the lower stage of FIG. 6, the air flows are represented as solid arrows. Thus, even if particles are generated from the vertical transfer mechanism 31 or the vicinity of the tower T2, such particles are removed with the air flow, which prevents the particles from adhering to the wafer W. The combination of the clean air supply part 36 and the exhaust port 35 constitutes a lateral air flow forming part.

Figure 4:
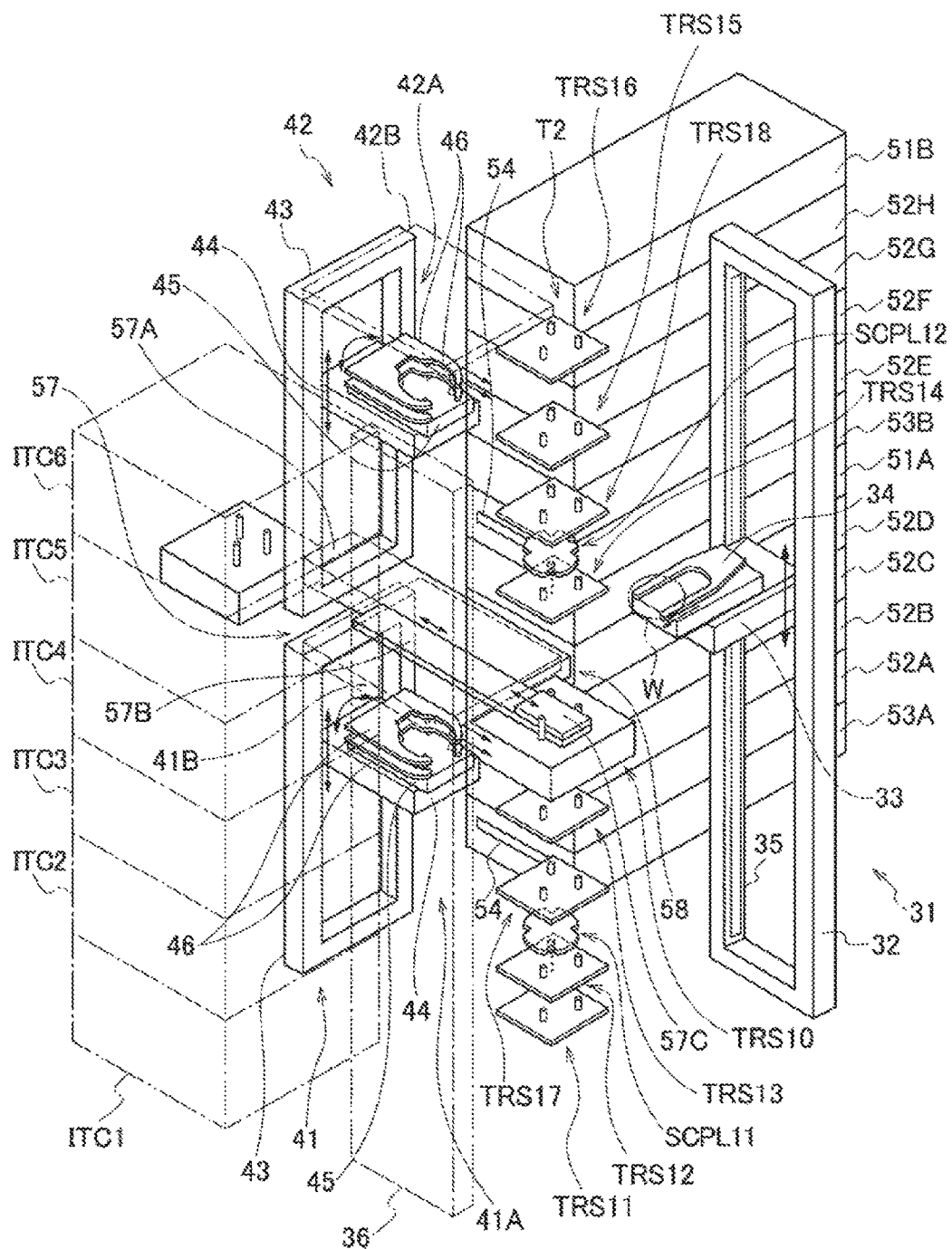
FIG. 4 is a perspective view of a middle block installed in the coating/developing apparatus.
Figure 5:
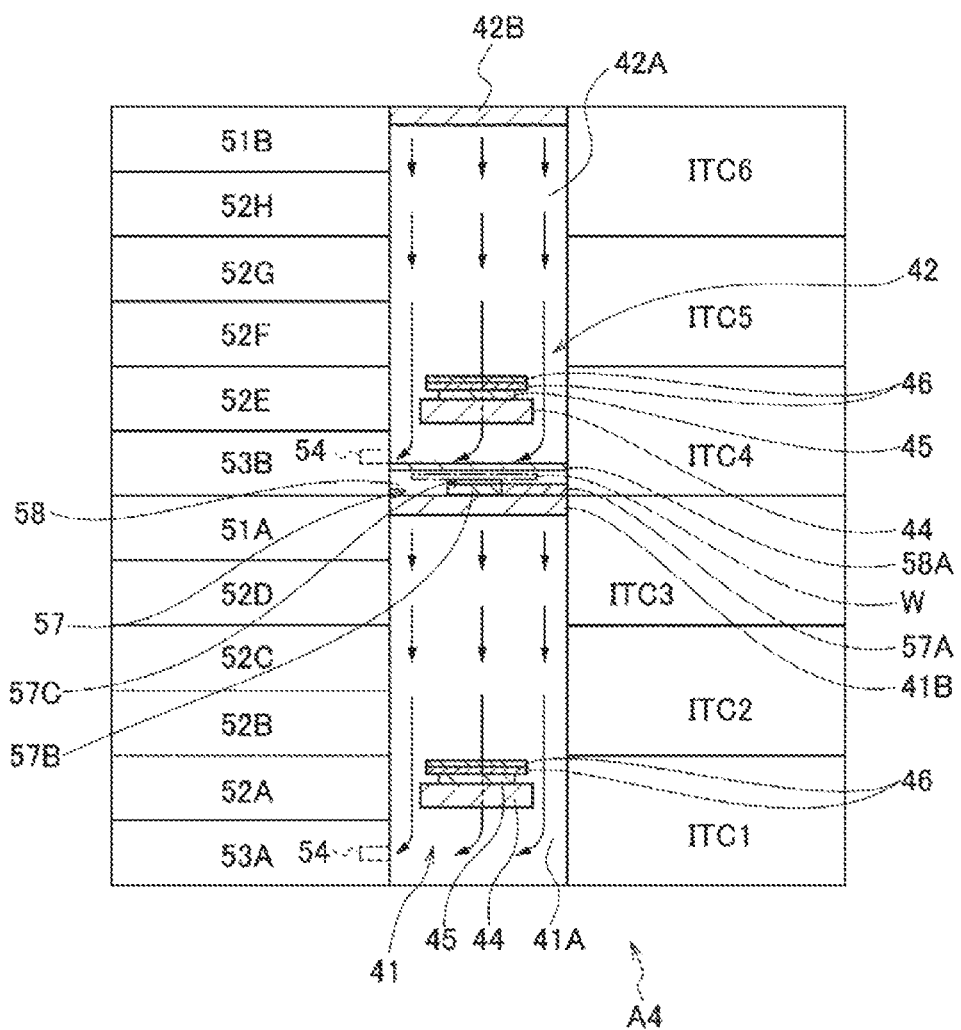
FIG. 5 is a schematic vertical sectional rear view of the middle block.

In FIGS. 4 and 5, in the rear side of the central portion of the middle block A4 in the left-right direction, the lower transfer mechanism 41 and the upper transfer mechanism 42 are disposed to be vertically overlapped with each other. The lower transfer mechanism 41 and the upper transfer mechanism 42 are similar to each other in configuration, and therefore, the lower transfer mechanism 41 will be described as a representative. The lower transfer mechanism 41 includes an elongated frame-like guide 43, an elevation station 44 configured to vertically move in a longitudinal direction of the guide 43, a rotatable table 45 configured to rotate about its vertical axis on the elevation station 44, and two support bodies 46, 46 installed on the rotatable table 45 to support the wafer W.

The two support bodies 46, 46 are configured to individually move forward and backward such that one receives the wafer W from a module and the other transfers the wafer W to the respective module. Further, each of the support bodies 46, 46 is formed to correspond to the shape of the plate of the temperature control module SCPL such that the wafer W can be delivered to the respective temperature control modules SCPL of the tower T2. Specifically, each of the support bodies 46, 46 includes a frame and a hook portion. The frame is formed to be divided into two parts which horizontally extend from a base end portion of the frame toward a leading end portion thereof, thus surrounding a lateral periphery of the wafer W. The hook portion is formed to protrude toward the inside of the frame such that the hook portion corresponds to the notch of the plate of the temperature control module SCPL, thus supporting a peripheral portion of the rear surface of the wafer W.

When viewed from the front side to the rear side, in the right side of the lower transfer mechanism 41 and the upper transfer mechanism 42, periphery exposing modules 51A and 51B, heating modules 52A to 52H, and exhaust units 53A and 53B are installed one above another. That is to say, the exhaust unit 53A, the heating modules 52A, 52B, 52C and 52D, the periphery exposing module 51A, the exhaust unit 53B, the heating modules 52E, 52F, 52G and 52H, and the periphery exposing module 51B are sequentially arranged from below. Each of the periphery exposing modules 51A and 51B exposes the peripheral portion of the wafer W to remove an unnecessary resist film existing on the peripheral portion of the wafer W. In some embodiments, each of the periphery exposing modules 51A and 51B may be configured to image the wafer W using a camera so as to inspect a state of the front surface of the wafer W before the exposure. Each of the heating modules 52A to 52H includes a heating plate configured to heat the wafer W mounted thereon, like the heating modules 22 of the processing block A3.

When viewed from the front side to the rear side, in the left side of the lower transfer mechanism 41 and the upper transfer mechanism 24, protective film forming modules ITC1 to ITC6 are disposed while being sequentially stacked one above another. The lower transfer mechanism 41 and the upper transfer mechanism 42A are disposed between a stacked body composed of the protective film forming modules ITC1 to ITC6 and a stacked body composed of the periphery exposing modules 51A and 51B, the heating modules 52A to 52H, and the exhaust units 53A and 53B, in the left-right direction. Each of the protective film forming modules ITC1 to ITC6 includes a single cup 23. A chemical liquid for forming a protective film is supplied onto the wafer W received in the cup 23 such that the protective film is formed to protect the resist film at the time of the liquid immersion lithography by the exposing apparatus A6. Among the six protective film forming modules, three modules disposed in a lower portion are represented as ITC1 to ITC3 and three modules disposed in an upper portion are represented as ITC4 to ITC6.

The protective film forming modules ITC1 to ITC3, the periphery exposing module 51A, the heating modules 52A to 52D, and the temperature control module SCPL11 are disposed at respective levels where the wafer W can be delivered by the lower transfer mechanism 41. Similarly, the protective film forming modules ITC4 to ITC6, the periphery exposing module 51B, the heating modules 52E to 52H, and the temperature control module SCPL12 are disposed at respective levels where the wafer W can be delivered by the upper transfer mechanism 42. The lower transfer mechanism 41 and the upper transfer mechanism 42 are configured to deliver the wafer W to respective delivery modules TRS of the tower T3 (which will be described later) in the interface block A5.

The delivery of the wafer W between the lower transfer mechanism 41 and the upper transfer mechanism 42 and the respective modules will be additionally described. Elevating pins (not shown) are respectively installed in the cup 23 of each of the protective film forming modules ITC1 to ITC6 and each of the periphery exposing modules 51A and 51B. By the elevating pins, the wafer W is delivered between the respective modules and the lower transfer mechanism 41 or the upper transfer mechanism 42. Further, each of the heating modules 52A to 52H includes: a plate formed similar to the plate of the temperature control module SCPL and configured to control a temperature of the wafer W; a moving mechanism configured to move the plate between the outside of the heating plate and above the heating plate; and elevating pins configured to deliver the wafer W between the heating plate and the plate moved above the heating plate. In a state where the plates of the heating modules 52A to 52H are positioned outside of the heating plate, the support body 46 of the lower transfer mechanism 41 or the upper transfer mechanism 42 moves up and down to deliver the wafer W therebetween.

In FIGS. 4 and 5, an area where the lower transfer mechanism 41 transfers the wafer W between the protective film forming modules ITC1 to ITC3 and the periphery exposing module 51A and the heating modules 52A to 52D is referred to as a transfer area 41A. An area where the upper transfer mechanism 42 transfers the wafer W between the protective film forming modules ITC4 to ITC6 and the periphery exposing module 51B and the heating modules 52E to 52H is referred to as a transfer area 42A. The exhaust units 53A and 53B include exhaust ports 54, respectively. The exhaust ports 54 and 54 of the exhaust units 53A and 53B are opened toward the transfer areas 41A and 42A, respectively.

Between the transfer areas 41A and 42A, a clean air supply part 41B is disposed to partition the transfer areas 41A and 42A from each other. A clean air supply part 42B is disposed in an upper portion of the transfer area 42A. Each of the clean air supply parts 41B and 42B is configured to have a horizontal thick plate shape with a clean air flow path formed therein. The clean air supplied into the flow path is discharged downward through a plurality of holes dispersedly formed in a lower surface of each of the clean air supply parts 41B and 42B. In the course of transferring the wafer W in the coating/developing apparatus 1, the supply operation of the clean air from the clean air supply parts 41B and 42B and the exhaust operation through the exhaust ports 54 and 54 of the exhaust units 53A and 53B are performed. With this configuration, as indicated by arrows in FIG. 5, in each of the transfer areas 41A and 42A, air flows which travel downwardly, followed by laterally turn at the lower end portion of each of the transfer areas 41A and 42A to be exhausted through the respective exhaust ports 54 and 54, are formed. With this configuration, even if particles as mists of the chemical liquid generated from each of the protective film forming modules ITC1 to ITC6 flows toward the respective transfer areas 41A and 42A, or particles generated from the lower transfer mechanism 41 and the upper transfer mechanism 42 are scattered toward the respective transfer areas 41A and 42A, such particles are removed from the respective transfer areas 41A and 42A, thus suppressing the particles from adhering to the wafer W. The combination of the clean air supply parts 41B and 42B, and the exhaust units 53A and 53B constitutes a descending air flow forming part The shuttle 57 used as a second substrate transfer mechanism is disposed between the clean air supply part 41B and the transfer area 42A. The shuttle 57 includes a guide 57A, a slider 57B and a shuttle body 57C. The guide 57A is formed to extend in the anteroposterior direction. The slider 57B is formed to horizontally move in the anteroposterior direction along the guide 57A and to have an elongated shape in the anteroposterior direction. The shuttle body 57C on which the wafer W is mounted, is configured to move between one end of the slider 57B and other end thereof in the longitudinal direction of the slider 57B. The shuttle body 57C is moved between the delivery module TRS10 of the tower T2 and the delivery module TRS20 of the tower T3 in the interface block A5. The delivery module TRS20 is configured similar to the delivery module TRS20 and includes elevating pins. The elevating pins of each of the delivery modules TRS10 and TRS20 are installed to move up and down without interfering with the shuttle body 57C moving over the delivery modules TRS10 and TRS20 such that the wafer W can be delivered between the shuttle body 57C and the delivery modules TRS10 and TRS20.

A transfer area 58 where the wafer W is transferred by the shuttle 57 is defined between the transfer area 41A of the wafer W by the lower transfer mechanism 41 and the transfer area 42A of the wafer W by the upper transfer mechanism 42, while being vertically overlapped with the transfer areas 41A and 42A. As shown in FIG. 5, a partition plate 58A is installed above the clean air supply part 41B. The transfer area 58 defined by the partition plate 58A and the clean air supply part 41B partitions the transfer area 41A and the transfer area 42A. The partition plate 58A is not shown in drawings except for FIG. 5.

Next, the interface block A5 will be described with reference to FIGS. 1 and 3. The interface block A5 includes the tower T3 installed in the central portion in the left-right direction. The tower T3 includes a plurality of delivery modules TRS stacked one above another. These delivery modules TRS include the delivery module TRS20 where the wafer W is delivered by the shuttle 57, and delivery modules TRS21 to TRS24 where the wafers W are respectively transferred by the lower transfer mechanism 41 and the upper transfer mechanism 42.

In the interface block A5, there are disposed transfer mechanisms 61 to 63, a rear surface cleaning module 64 configured to clean the rear surface of the wafer W before exposure, and a front surface cleaning module 65 configured to clean the front surface of the wafer W after exposure. The rear surface cleaning module 64 supplies a cleaning solution onto the rear surface of the wafer W to clean the wafer W by brushing with a brush. The front surface cleaning module 65 supplies a cleaning solution onto the front surface of the wafer W to clean the wafer W. The transfer mechanism 61 is configured to transfer the wafer W between the delivery modules TRS23 and TRS24 of the tower T3 and the exposing apparatus A6. The transfer mechanisms 62 and 63 are configured to move up and down to transfer the wafer W between the respective delivery modules TRS constituting the tower T3. The transfer mechanism 62 can deliver the wafer W to the rear surface cleaning module 64, and the transfer mechanism 63 can deliver the wafer W to the front surface cleaning module 65.

As shown in FIG. 1, the coating/developing apparatus 1 includes a control part 100. The control part 100 is provided with, for example, a computer, and includes a program storage (not shown). The program storage stores a program organized with instructions (steps) for performing the transfer of the wafer W and the process of the wafer W in the respective modules, which will be described later. The control part 100 outputs control signals to the respective parts of the coating/developing apparatus 1 such that the stored program executes the respective transfer mechanisms to transfer the wafer W and executes the respective modules to process the wafer W. Such a program is stored in the program storage while being stored in a storage medium such as a hard disk, a compact disk, a magnet-optical disk, a memory card, or the like.

Figure 7:
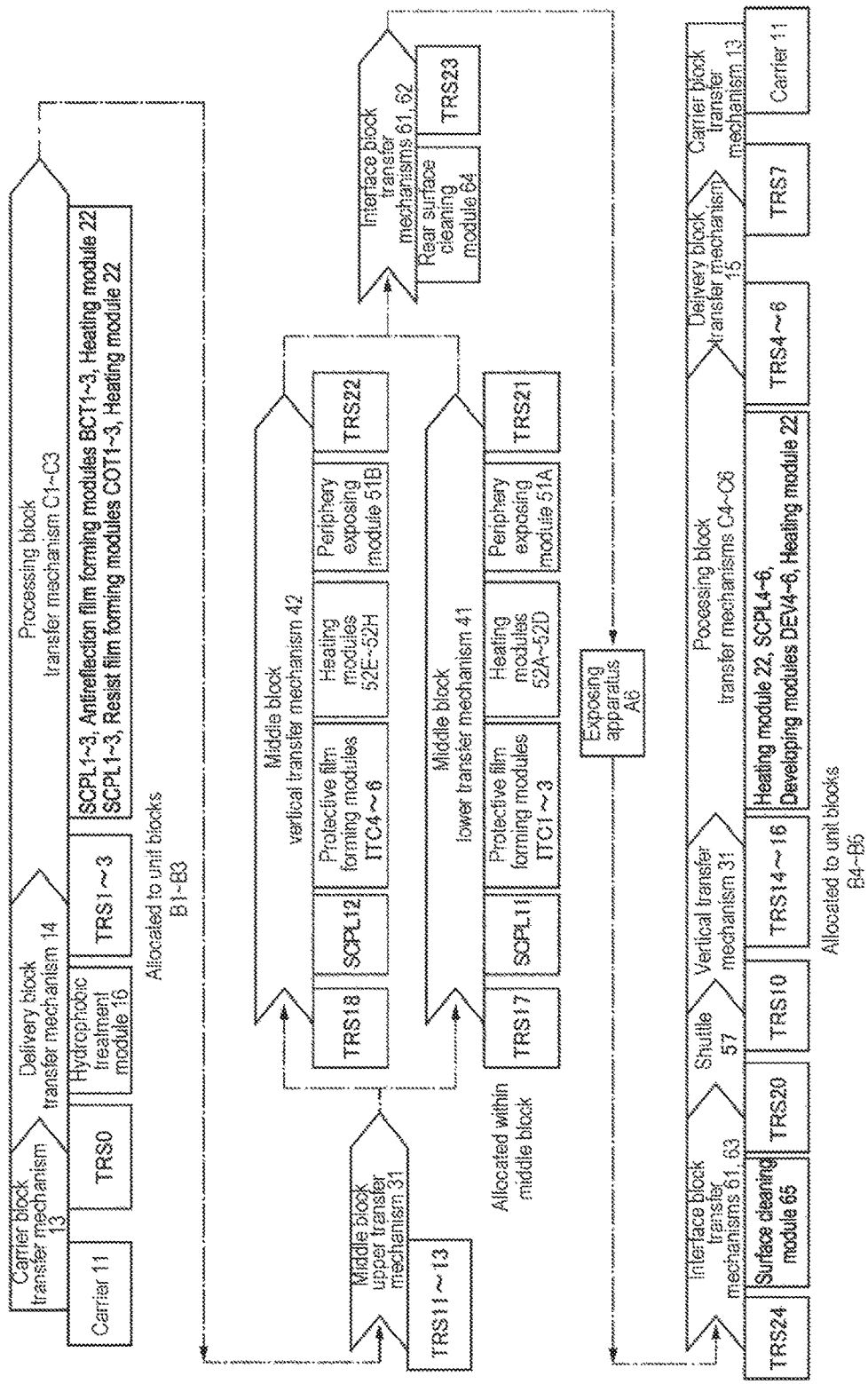
FIG. 7 is a view showing a transfer route of a wafer in the coating/developing apparatus.

In the coating/developing apparatus 1, the transfer operations of the wafer W performed by the respective transfer mechanisms are performed in parallel, and the processes of the wafer W performed in the respective modules are also performed in parallel. Next, transfer routes of the wafer W and treatment processes in the coating/developing apparatus 1 will be described with reference to FIGS. 3 and 7. FIG. 7 shows a sequence in which the wafer W is transferred in a series of modules, wherein a series of transfer mechanisms is mapped to the respective modules. In FIG. 3, directions in which the wafer W is transferred to some of the delivery modules TRS are indicated by solid arrows.

The wafer W picked up from the carrier 11 by the transfer mechanism 13 of the carrier block A1 is transferred to the delivery module TRS0 of the tower T1. Subsequently, by the transfer mechanism 14 of the delivery block A2, the wafer W is transferred to the hydrophobizing module 16 where the wafer W is subjected to a hydrophobic treatment. After that, the wafer W is transferred to one of the delivery modules TRS1 to TRS3 by the transfer mechanism 14. In other words, the wafer W is allocated to be loaded into one of the unit blocks B1 to B3.

The wafer W transferred to the delivery module TRS1 is transferred by the transfer mechanism C1 in the following order of: the temperature control module SCPL1 of the tower T1→the antireflection film forming module BCT1→the heating module 22→the temperature control module SCPL1→the resist film forming module COT1→the heating module 22. Thus, the antireflection film is formed on the front surface of the wafer W, and subsequently, the resist film is formed to coat the antireflection film. After that, the wafer W is transferred to the delivery module TRS11 of the tower T2 in the middle block A4 by the transfer mechanism C1.

The wafers W transferred to the delivery modules TRS2 and TRS3 are respectively transferred and processed similar to the wafer W transferred to the delivery module TRS1, except that the wafers W transferred to the respective delivery modules TRS2 and TRS3 are individually transferred by the respective transfer mechanisms C2 and C3 and the wafers W are transferred to respective modules positioned at levels corresponding to the unit blocks B2 and B3, respectively. A specific transfer route is as follows. The wafer W transferred to the delivery module TRS2 is transferred in the following order of: the temperature control module SCPL2→the antireflection film forming module BCT2→the heating module 22→the temperature control module SCPL2→the resist film forming module COT2→the heating module 22→the delivery module TRS12 of the tower T2. The wafer W transferred to the delivery module TRS3 is transferred in the following order of: the temperature control module SCPL3→the antireflection film forming module BCT3→the heating module 22→the temperature control module SCPL3→the resist film forming module COT3→the heating module 22→the delivery module TRS13.

The wafer W transferred to each of the delivery modules TRS11 to TRS13 of the tower T2 is transferred to be allocated to the delivery module TRS17 or TRS18 by the vertical transfer mechanism 31 of the middle block A4. Subsequently, the wafer W transferred to the delivery module TRS17 is transferred by the lower transfer mechanism 41 in the following order of: the temperature control module SCPL11→one of the protective film forming modules ITC1 to ITC3→one of the heating modules 52A to 52D→the periphery exposing module 51A. Thus, the protective film is formed on the resist film, and then the peripheral portion of the resist film is exposed through the protective film. After that, the wafer W is transferred to the delivery module TRS21 of the tower T3 in the interface block A5 by the lower transfer mechanism 41.

The wafer W transferred to the delivery module TRS18 is transferred and processed similar to the wafer W transferred to the delivery module TRS17, except that wafer W transferred to the delivery module TRS18 is transferred by the upper transfer mechanism 42 and is transferred to a module positioned at a level corresponding to the upper transfer mechanism 42. A specific transfer route is as follows. The wafer W transferred to the delivery module TRS18 is transferred in the following order of: the temperature control module SCPL12→one of the protective film forming modules ITC4 to ITC6→one of the heating modules 52E to 52H→the periphery exposing module 51B→the delivery module TRS22 of the tower T3.

The wafer W transferred to each of the delivery modules TRS21 and TRS22 is transferred, by the transfer mechanism 62, to the rear surface cleaning module 64 where the rear surface of the wafer W is cleaned. Thereafter, the wafer W is transferred to the delivery module TRS23, followed by being transferred by the transfer mechanism 61 to the exposing apparatus A6 where the wafer W is subjected to the exposure treatment. After that, the wafer W is transferred to the delivery module TRS24 by the transfer mechanism 61. Subsequently, by the transfer mechanism 63, the wafer W is transferred to the front surface cleaning module 65 wherein the front surface of the wafer W is cleaned. Thereafter, the wafer W is transferred to the delivery module TRS20 of the tower T3, followed by being directly transferred to the delivery module TRS10 of the tower T2 by the shuttle 57. In other words, the wafer W is transferred without passing through the protective film forming modules ITC1 to ITC6, the heating modules 52A to 52H, and the periphery exposing modules 51A to 51B which are the processing modules of the middle block A4.

After that, the wafer W is transferred from the delivery module TRS10 to one of the delivery modules TRS14 to TRS16 by the vertical transfer mechanism 31. In other words, the wafer W is allocated to be loaded into one of the unit blocks B4 to B6. The wafer W transferred to the delivery module TRS14 is transferred by the transfer mechanism C4 in the following order of: the heating module 22→the temperature control module SCPL4 of the tower T1→the developing module DEV4. Thus, the wafer W after the exposure treatment is subjected to a sequence of heating and development treatments such that the resist pattern is formed on the resist film. Subsequently, the wafer W is transferred by the transfer mechanism C4 to the heating module 22 where the wafer W is subjected to the heat treatment. Thereafter, the wafer W is transferred to the delivery module TRS4 of the tower T1 in the delivery block A2.

The wafer W transferred to each of the delivery modules TRS15 and TRS16 is transferred and processed similar to the wafer W transferred to the delivery module TRS14, except that the wafers W transferred to the delivery modules TRS15 and TRS16 are individually transferred by the respective transfer mechanisms C5 and C6 and are transferred to respective modules positioned at levels corresponding to the unit blocks B5 and B6. A specific transfer route is as follows. The wafer W transferred to the delivery module TRS15 is transferred in the following order of: the heating module 22→the temperature control module SCPL5→the developing module DEV5→the heating module 22→the delivery module TRS5 of the tower T1. The wafer W transferred to the delivery module TRS16 is transferred in the following order of: the heating module 22→the temperature control module SCPL6→the developing module DEV6→the heating module 22→the delivery module TRS6 of the tower T1. The wafer W transferred to each of the delivery modules TRS4 to TRS6 is transferred to the delivery module TRS7 of the tower T1 by the transfer mechanism 15 of the delivery block A2 and subsequently, returned to the carrier 11 by the transfer mechanism 13 of the carrier block A1.

The coating/developing apparatus 1 is provided with the middle block A4 which performs various treatments with respect to the wafer W on which the resist film is formed in the processing block A3, before the exposure treatment. The middle block A4 includes: the stacked body of the plurality of protective film forming modules ITC1 to ITC6 as the processing modules: the stacked body of the plurality of heating modules 52A to 52H and the plurality of periphery exposing modules 51A and 51B as the processing modules: the tower T2 composed by stacking the delivery modules TRS through which the wafers W are transferred from the processing block A3 to the middle block A4; the vertical transfer mechanism 31, the lower transfer mechanism 41 and the upper transfer mechanism 42 which are configured to transfer the wafer W from the respective delivery modules TRS of the tower T2 to respective modules of each of the stacked bodies, and transfer the wafer W that has been processed in the respective modules to the interface block A5, and the shuttle 57 configured to directly transfer the wafer W from the delivery module TRS20 of the interface block A5 to the delivery module TRS10 of the tower T2 so as to develop the wafer W after the exposure treatment. By forming the stacked bodies of the processing modules as described above, it is possible to increase the number of each of the protective film forming modules ITC1 to ITC6, the heating modules 52A to 52H, and the periphery exposing modules 51A and 51B, which are installed in the middle block A4. It is also possible to suppress an increase in footprint of the middle block A4, and further, the coating/developing apparatus 1. Further, the installation of the shuttle 57 allows the wafer W after the exposure treatment to be rapidly returned to the processing block A3. This eliminates a need to operate the lower transfer mechanism 41 or the upper transfer mechanism 42 which is configured to transfer the wafers W to the respective processing modules of the staked bodies, thus returning the wafer W after the exposure treatment to the processing block A3. This reduces a load borne by each of the lower transfer mechanism 41 and the upper transfer mechanism 42. As a result, it is possible to increase throughput of the coating/developing apparatus 1.

Further, in the stacked body of the protective film forming modules ITC1 to ITC6, the stacked body of the heating modules 52A to 52H and the periphery exposing modules 51A and 51B, and the temperature control modules SCPL11 and SCPL12 of the tower T2, the delivery of the wafer W to the modules disposed in the lower portion is performed by the lower transfer mechanism 41, and the delivery of the wafer W to the modules disposed in the upper portion is performed by the upper transfer mechanism 42. As described above, the different transfer mechanisms 41 and 42 are allocated to transfer the wafers W to the same type of the modules stacked one above another. This surely reduces a load borne by each of the transfer mechanisms 41 and 42, which makes it possible to more reliably increase throughput. The term "the same type of modules" used herein represents modules in which the wafers W are transferred in the same sequence starting at the carrier 11, and are subjected to the same treatment.

Moreover, the lower transfer mechanism 41 and the upper transfer mechanism 42 are disposed to be vertically overlapped with each other, thus suppressing an increase in footprint of the middle block A4, which is caused by separately disposing the lower transfer mechanism 41 and the upper transfer mechanism 42. Further, the transfer area 58 of the wafer W by the shuttle 57 is defined between the transfer area 41A of the wafer W by the lower transfer mechanism 41 and the transfer area 42A of the wafer W by the upper transfer mechanism 42. Therefore, it is possible to more reliably suppress the footprint of the middle block A4.

Second Embodiment

Figure 8:
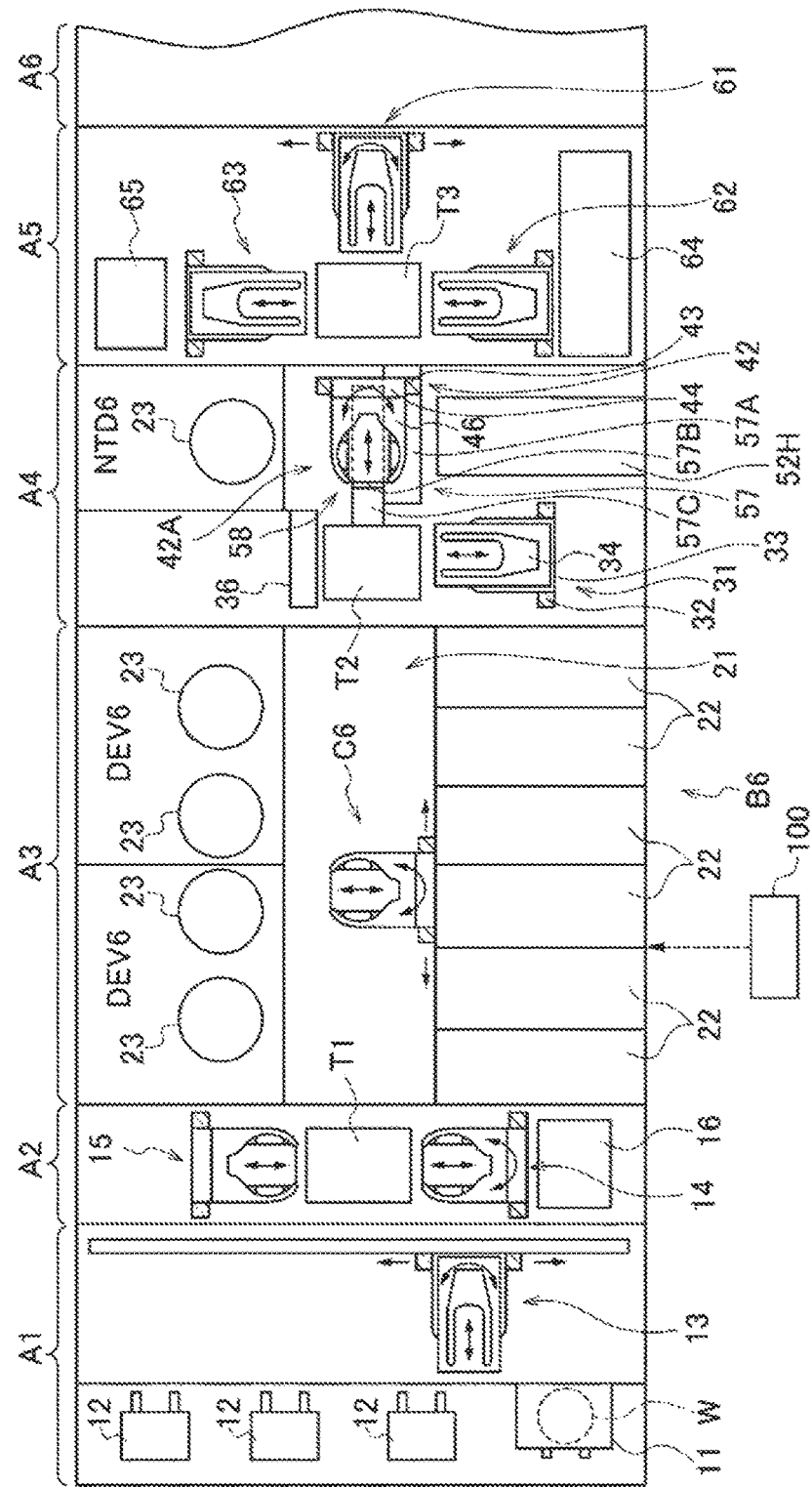
FIG. 8 is a plane view of a coating/developing apparatus according to a second embodiment of the present disclosure.
Figure 9:
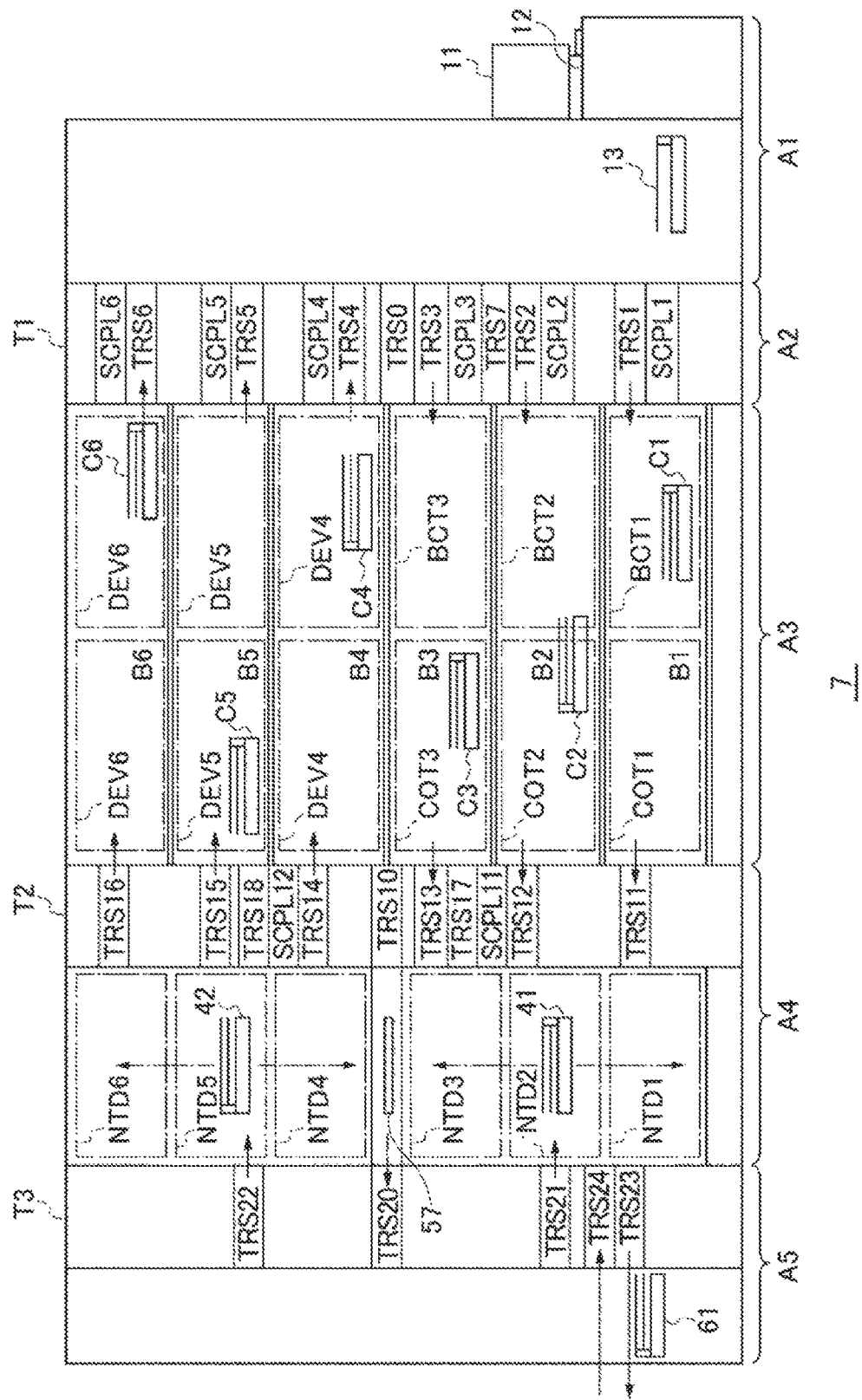
FIG. 9 is a schematic vertical sectional view of the coating/developing apparatus according to the second embodiment.
Figure 10:
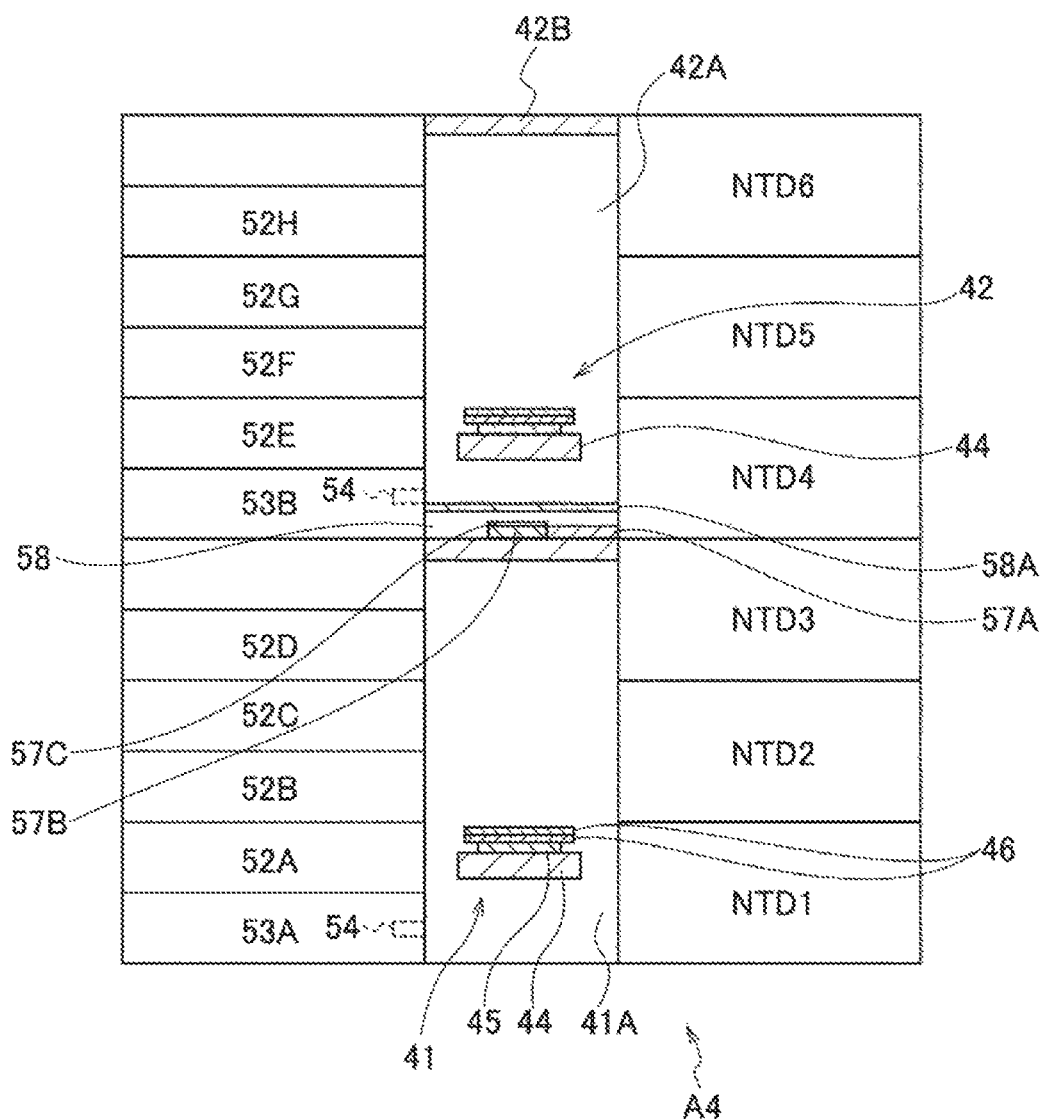
FIG. 10 is a schematic vertical sectional rear view of a middle block in the second embodiment.

Next, a coating/developing apparatus 7 according to a second embodiment will be described with a focus on the differences from the coating/developing apparatus 1. FIGS. 8 and 9 are a plane view and a schematic vertical sectional view of the coating/developing apparatus 7, respectively. FIG. 10 is a schematic vertical sectional rear view of the middle block A4 of the coating/developing apparatus 7. The middle block A4 of the coating/developing apparatus 7 is provided with developing modules NTD1 to NTD6, instead of the protective film forming modules ITC1 to ITC6.

The developing modules NTD1 to NTD6 differ from the protective film forming modules ITC1 to ITC6 in that they are configured to supply, instead of the chemical liquid for forming the protective film, a developing solution to the wafer W so as to perform a development treatment (hereinafter, referred to as a "negative development treatment") for removing an unexposed area in the resist film. In the coating/developing apparatus 7, after the resist film is formed on the wafer W, the wafer W is transferred to a respective one of the developing modules DEV4 to DEV6 where the wafer W is subjected to the positive development treatment, and the wafer W is transferred to a respective one of the developing modules NTD1 to NTD6 where the wafer W is subjected to the negative development treatment.

Like the coating/developing apparatus 1, the coating/developing apparatus 7 includes the middle block A4 in which the heating modules 52A to 52H are stacked one above another. However, unlike the heating modules 52A to 52H of the coating/developing apparatus 1, the heating modules 52A to 52H of the coating/developing apparatus 7 are configured to heat the wafer W after the exposure treatment. Further, in the middle block A4 of the second embodiment, the periphery exposing modules 51A and 51B are not installed. In some embodiments, the periphery exposing modules may be respectively stacked on the heating modules 22 of the unit blocks B1 to B3 such that the wafer W having a resist coated thereon is subjected to the periphery exposure treatment in each of the unit blocks B1 to B3.

Figure 11:
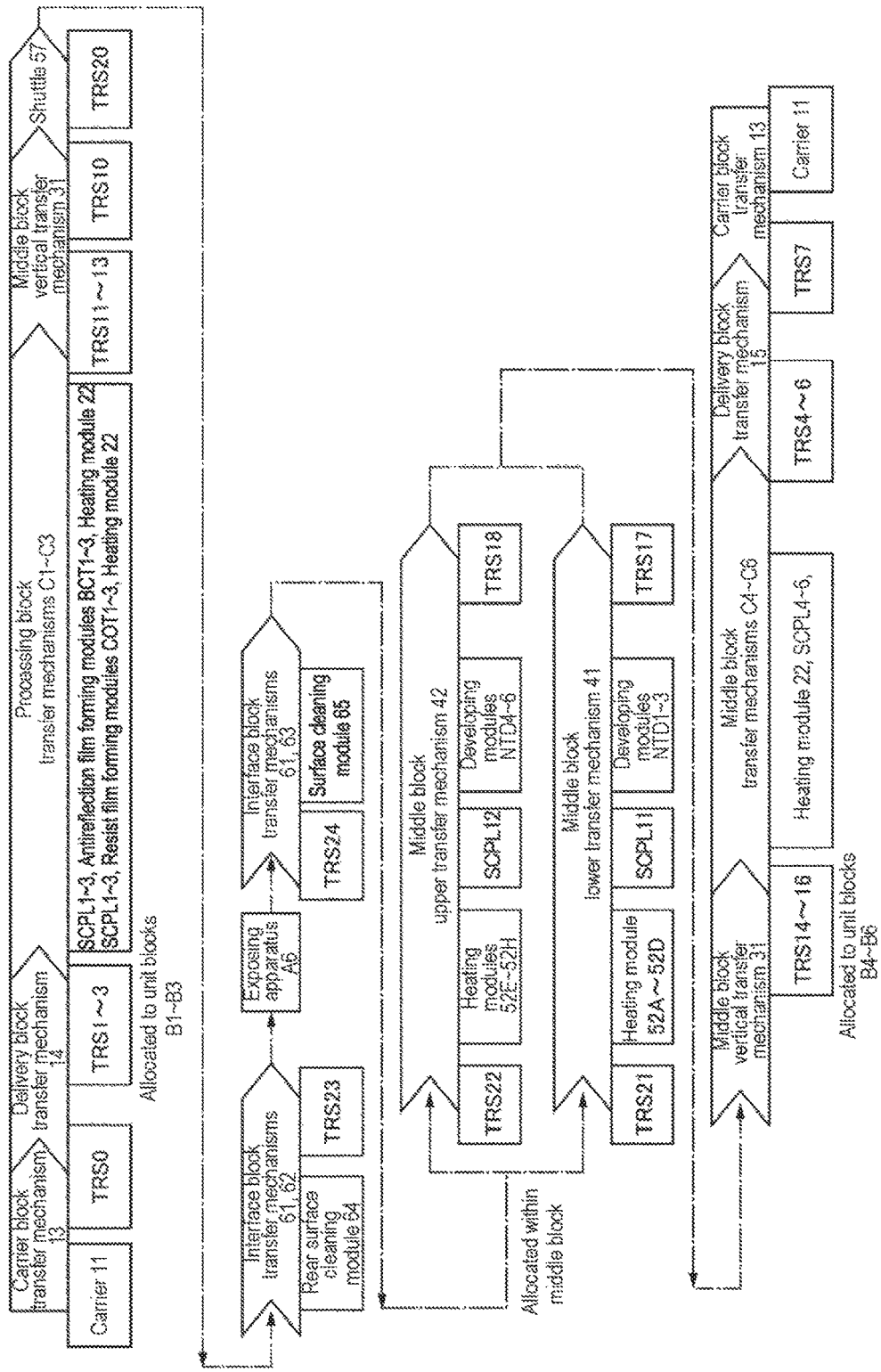
FIG. 11 is a view showing a transfer route of a wafer in the coating/developing apparatus according to the second embodiment.

In the coating/developing apparatus 7, a transfer route of the wafer W when performing the negative development treatment by supplying a resist to the wafer W will be described with reference to FIG. 11, with a focus on the differences from the transfer route of the wafer W in the coating/developing apparatus 1 of the first embodiment. Like the first embodiment, the wafers W picked up from the carrier 11 are transferred to the respective unit blocks B1 to B3 where the antireflection film and the resist film are formed on each of the wafers W. Subsequently, the wafers W are transferred to the respective delivery modules TRS11 to TRS13 of the tower T2 in the middle block A4. After that, each of the wafers W is transferred in the following order of: the vertical transfer mechanism 31→the delivery module TRS10→the shuttle 57→the delivery module TRS20 of the interface block A5, and subsequently, is transferred from the delivery module TRS20 to the transfer mechanism 62. Thereafter, like the first embodiment, the wafer W is transferred into the interface block A5, followed by between the interface block A5 and the exposing apparatus A6, so that the wafer W is sequentially subjected to the rear surface cleaning treatment, the exposure treatment, and the front surface cleaning treatment.

The wafer W unloaded from the front surface cleaning module 65 is transferred to the delivery module TRS21 or TRS22 by the transfer mechanism 63. The wafer W transferred to the delivery module TRS21 is transferred by the lower transfer mechanism 41 in the following order of: one of the heating modules 52A to 52D→the temperature control module SCPL11 of the tower T2→one of the developing modules NTD1 to NTD3 so that the wafer after the exposure treatment is sequentially subjected to the heat treatment and the development treatment. Thereafter, the wafer W is transferred to the delivery module TRS17.

The wafer W transferred to the delivery module TRS22 is transferred and processed similar to the wafer W transferred to the delivery module TRS21 except that the wafer W is transferred by the upper transfer mechanism 42 and the wafer W is transferred to a module positioned at a level corresponding to the upper transfer mechanism 42. A specific transfer route is as follows. The wafer W is transferred in the following order of: one of the heating modules 52E to 52H→the temperature control module SCPL12→one of the developing modules NTD4 to NTD6→the delivery module TRS18.

The wafer W transferred to the delivery module TRS17 or TRS18 is transferred to one of the delivery modules TRS14 to TRS16 by the vertical transfer mechanism 31. In other words, the wafer W is allocated to one of the unit blocks B4 to B6. The wafer W transferred to the delivery module TRS14 is transferred by the transfer mechanism C4 to the heating module 22 where the wafer W after the development treatment is subjected to heat treatment. After that, the wafer W is transferred in the following order of: the temperature control module SCPL4→the delivery module TRS4.

The wafers W transferred to the delivery modules TRS15 and TRS16 are transferred similar to the wafer W transferred to the delivery module TRS14 except that the wafers W are transferred by the respective transfer mechanisms C5 and C6, and the wafers W are respectively transferred to modules at levels corresponding to the unit blocks B5 and B6. Subsequently, the wafers W are sequentially subjected to the heat treatment and the temperature control treatment, and then transferred to the delivery modules TRS5 and TRS6, respectively. After that, the wafer W transferred to each of the delivery modules TRS4 to TRS6 is transferred to the delivery module TRS7 by the transfer mechanism 15, and returned to the carrier 11 by the transfer mechanism 13.

Next, a transfer route and a treatment process of the wafer W when performing the positive development treatment by supplying the resist on the wafer W in the coating/developing apparatus 7 will be described. Like the negative development treatment, the wafer W is transferred in the following order of: the carrier block A1→the delivery block A2→the unit blocks B1 to B3 of the processing block A3→the shuttle 57 of the middle block A4→the interface block A5→the exposing apparatus A6→the interface block A5, so that the wafer W is sequentially subjected to treatments.

After that, the wafer W is transferred to the middle block A4 where the wafer W after the exposure treatment is subjected to the heat treatment by a respective one of the heating modules 52A to 52H. Subsequently, the wafer W is transferred to one of the delivery modules TRS14 to TRS16 by the lower transfer mechanism 41, the upper transfer mechanism 42, and the vertical transfer mechanism 31, and then allocated to a respective one of the unit blocks B4 to B6. After that, like the first embodiment, the wafers W are respectively transferred into the unit blocks B4 to B6 where the wafers W are subjected to the development treatment by the respective developing modules DEV4 to DEV5. Subsequently, each of the wafers W is returned to the carrier 11. The coating/developing apparatus 7 has effects similar to those of the coating/developing apparatus 1.

Third Embodiment

Figure 12:
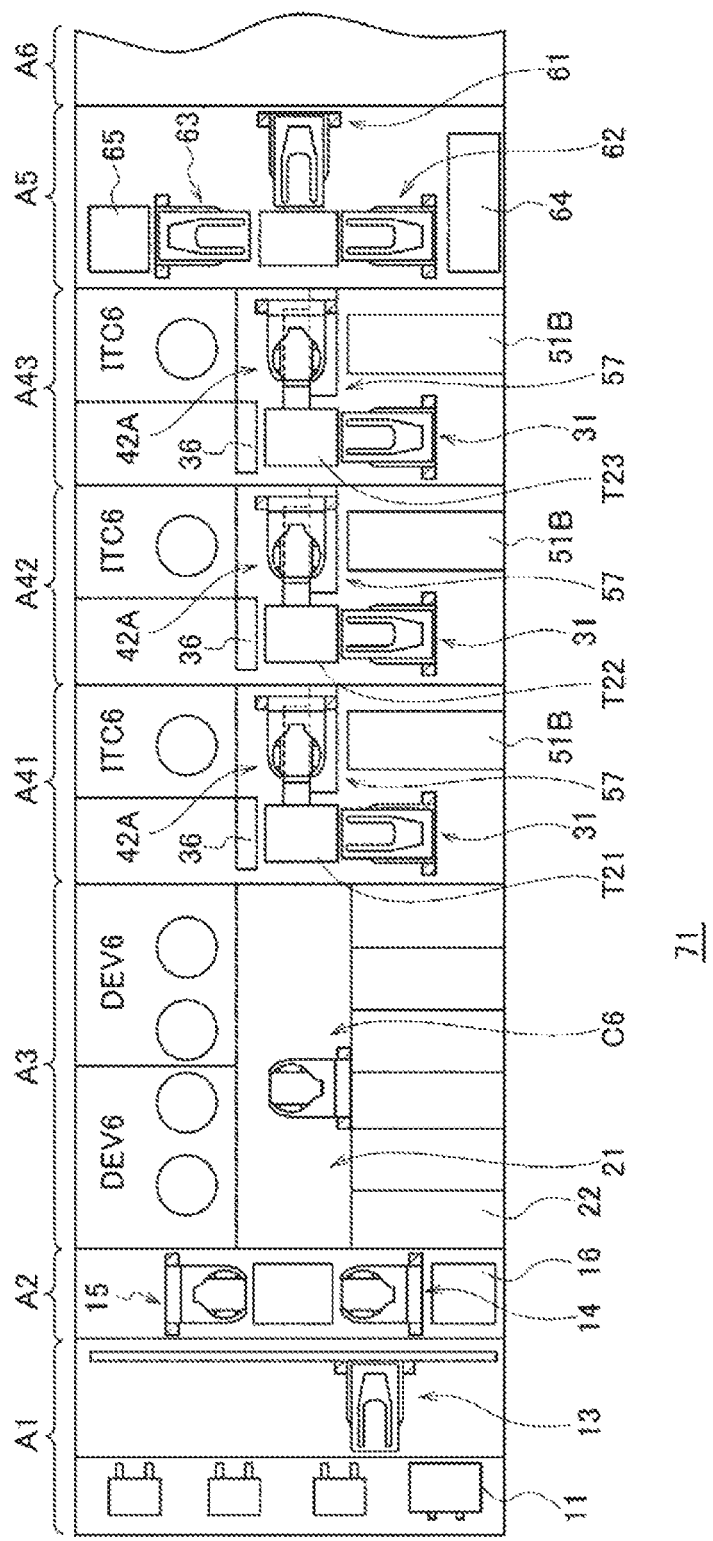
FIG. 12 is a plane view of a coating/developing apparatus according to a third embodiment of the present disclosure.

A coating/developing apparatus 71 according to a third embodiment will be described with reference to a plane view of FIG. 12, with a focus on the differences from the coating/developing apparatus 1. The coating/developing apparatus 71 includes middle blocks A41 to A43 which are arranged in that order from the front side to the rear side between the processing block A3 and the interface block A5. The middle blocks A41 to A43 and the interface block A5 are disposed adjacent to each other and are partitioned from each other. The middle blocks A41 to A43 are configured similar to the middle block A4 of the coating/developing apparatus 1.

Figure 13:
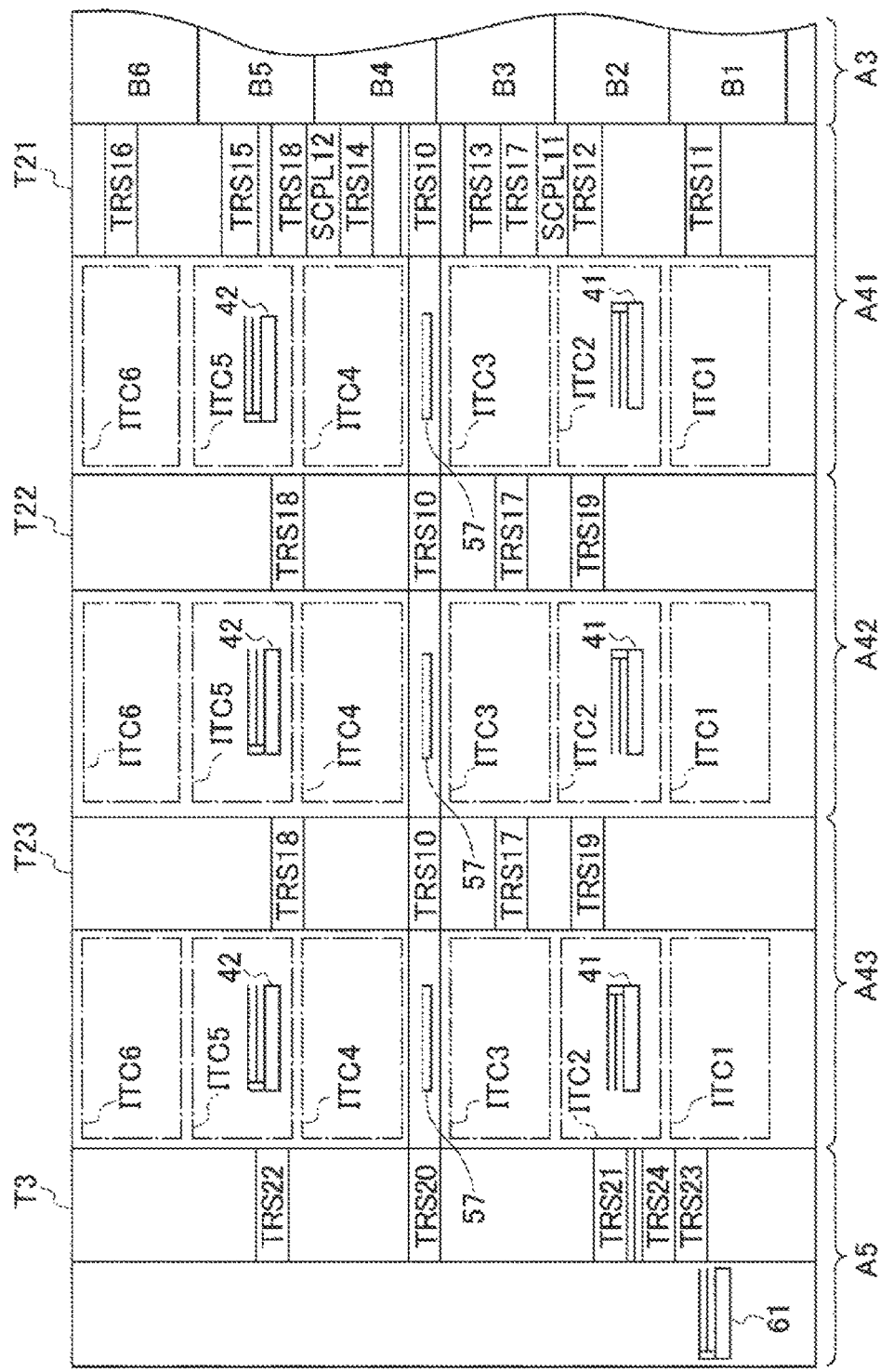
FIG. 13 is a schematic vertical sectional view of blocks which constitute the coating/developing apparatus according to the third embodiment.

FIG. 13 is a schematic vertical sectional view of the middle blocks A41 to A43. In the middle blocks A41 to A43, towers corresponding to the tower T2 are represented as T21 to T23. Further, a delivery module disposed in a lower portion of each of the towers T22 and T23 so as to load the wafer W from a block positioned in a front stage thereof (which will be described later) is represented as TRS19. In the coating/developing apparatus 71, the wafer W is subjected to a sequence of treatments by the temperature control module SCPL, the protective film forming modules ITC1 to ITC6, the heating modules 52A to 52H, and the periphery exposing modules 51A and 51B in one of the middle blocks A41 to A43.

An example of a specific transfer procedure in the coating/developing apparatus 71 will be described. The wafer W is transferred to one of the unit blocks B1 to B3 where a resist film is formed on the wafer W. Subsequently, the wafer W is delivered to a respective one of the delivery modules TRS11 to TRS13 of the tower T21 of the middle block A41. After the wafer W is subjected to the aforementioned treatments in the middle block A41, the wafer W is transferred in the following order of: the respective one of the delivery modules TRS11 to TRS13→the vertical transfer mechanism 31 of the middle block A41→the delivery module TRS17 or TRS18 of the tower T21, and then delivered to the lower transfer mechanism 41 or the upper transfer mechanism 42 of the middle block A41. Thereafter, like the first embodiment, the wafer W is transferred between the respective modules and is subjected to respective treatments in the middle block A41. After that, the wafer W held by the lower transfer mechanism 41 of the middle block A41 is transferred to, for example, the delivery module TRS21 of the tower T3 of the interface block A5 through the lower transfer mechanism 41 of the middle block A42 or A43 and the delivery module TRS17 of the tower T22 or T23. The wafer W held by the upper transfer mechanism 42 of the middle block A41 is transferred to the delivery module TRS22 of the tower T3 through the upper transfer mechanism 42 of the middle block A42 or A43 and the delivery module TRS18 of the tower T22 or T23.

A description will be made as to a case where the wafer W delivered to one of the delivery modules TRS11 to TRS13 of the tower T21 is subjected to respective treatments in the middle block A42. As an example, the wafer W is transferred in the following order of: the lower transfer mechanism 41 of the middle lock A41→the delivery module TRS19 of the tower T22→the vertical transfer mechanism 31 of the middle block A42→the delivery module TRS17 or TRS18 of the tower T22, and then subjected to respective treatments in the middle block A42 by the lower transfer mechanism 41 and the upper transfer mechanism 42 of the middle block A42. After that, like the treatments of the wafer W in the middle block A42, the wafer W is transferred to a respective one of the delivery module TRS21 and TRS22 of the tower T3 through the delivery module TRS17 or TRS18 of the tower T23, and the lower transfer mechanism 41 and the upper transfer mechanism 42 of the middle block A43. A description will be made as to a case where the wafer W delivered to one of the delivery modules TRS11 to TRS13 of the tower T21 is subjected to respective treatments in the middle block A43. As an example, the wafer W is transferred in the following order of: the lower transfer mechanism 41 of the middle block A41→the delivery module TRS19 of the tower T22→the lower transfer mechanism 41 of the middle block A42→the delivery module TRS19 of the tower T23→the vertical transfer mechanism 31 of the middle block A43→the delivery module TRS17 or TRS18 of the tower T23, and then subjected to respective treatments in the middle block A43 by the lower transfer mechanism 41 and the upper transfer mechanism 42 of the middle block A43. Subsequently, the wafer W is transferred to a respective one of the delivery module TRS21 and TRS22 of the tower T3.

After that, the wafer W is subjected to the exposure treatment and then transferred to the delivery module TRS20 of the tower T3. Subsequently, the wafer W is transferred in the following order of: the shuttle 57 of the middle block A43→the delivery module TRS10 of the tower T23→the shuttle 57 of the middle block A42→the delivery module TRS10 of the tower T22→the shuttle 57 of the middle block A41→the delivery module TRS10 of the tower T21. Thereafter, like the first embodiment, the wafer W is transferred to one of the unit blocks B4 to B6 where the wafer is subjected to the development treatment.

As described above, the coating/developing apparatus 71 includes a plurality of middle blocks A41, A42 and A43, which makes it possible to suppress an increase in footprint of the apparatus 71, and further increase the number of the modules. In some embodiments, the coating/developing apparatus 7 according to the second embodiment may include a plurality of middle blocks similar to the coating/developing apparatus 71.

Fourth Embodiment

Figure 14:
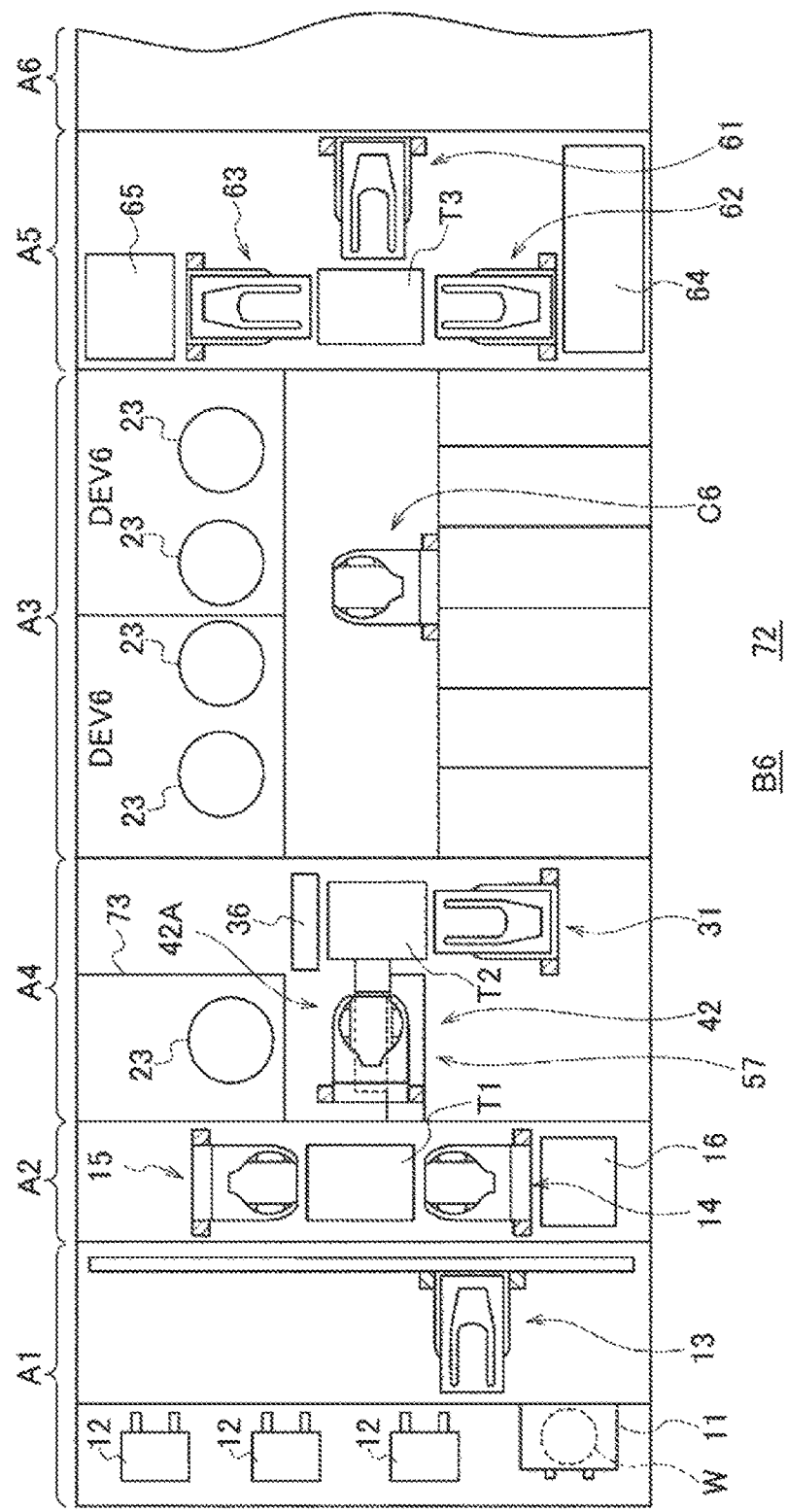
FIG. 14 is a plane view of a coating/developing apparatus according to a fourth embodiment of the present disclosure.

A coating/developing apparatus 72 according to a fourth embodiment will be described with reference to a plane view of FIG. 14, with a focus on the differences from the coating/developing apparatus 1. The coating/developing apparatus 72 differs from the coating/developing apparatus 1 in that the middle block A4 is disposed between the delivery block A2 and the processing block A3. Further, the middle block A4 is provided with a plurality of rear surface cleaning modules 73 which is stacked one above another and is similar to the rear surface cleaning module 64, instead of the protective film forming modules ITC1 to ITC6. The wafer W after the development treatment is transferred to the rear surface cleaning module 73 where the rear surface of the wafer W is cleaned, and subsequently returned to the carrier 11.

In the middle block A4 of the coating/developing apparatus 72, the heating modules 52A to 52H and the periphery exposing modules 51A and 51B are not installed. Further, the lower transfer mechanism 41 and the upper transfer mechanism 42 are disposed at a front side in the middle block A4 such that they can deliver the wafer W to respective modules constituting the tower T1 of the delivery block A2. Further, the tower T2 and the vertical transfer mechanism 31 are disposed at a rear side in the middle block A4. The wafers W are delivered to respective modules constituting the tower T2 by the transfer mechanisms C1 to C6 of the unit blocks B1 to B6, respectively.

Figure 15:
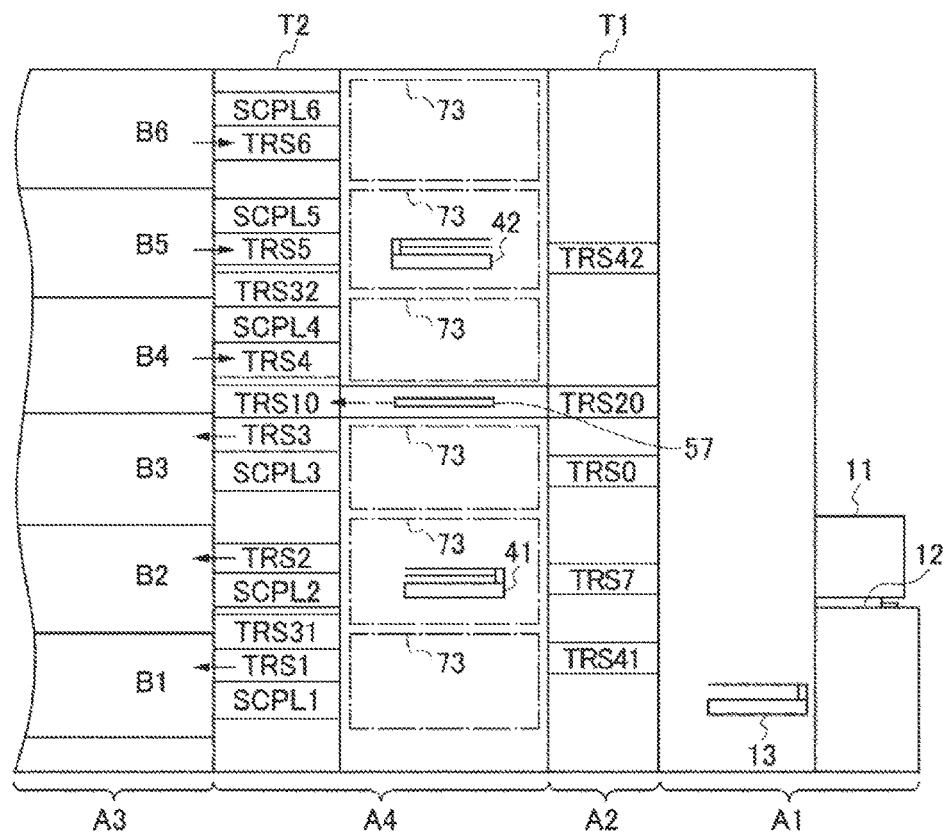
FIG. 15 is a schematic vertical sectional view of blocks which constitute the coating/developing apparatus according to the fourth embodiment.

FIG. 15 shows an example of an arrangement of the modules in each of the towers T1 and T2. In the coating/developing apparatus 1, the delivery modules TRS1 to TRS6 and the temperature control modules SCPL1 to SCPL6 corresponding to the respective unit blocks B1 to B6 are disposed in the tower T1, whereas in the coating/developing apparatus 72, they are disposed in the tower T2. Further, delivery modules TRS31 and TRS32 in each of which the wafer W is delivered by the lower transfer mechanism 41 and the upper transfer mechanism 42, are disposed in the tower T2.

In the tower T1 of the coating/developing apparatus 72, there are disposed delivery modules TRS41 and TRS42 where the wafers W are respectively delivered by the lower transfer mechanism 41 and the upper transfer mechanism 42, in addition to the delivery modules TRS0 and TRS7 in each of which the wafer W is delivered by the transfer mechanism 13 of the carrier block A1 like the coating/developing apparatus 1. Although the tower T3 of the interface block A5 is not shown, the delivery modules TRS of the tower T3 are disposed at levels corresponding to the respective unit blocks B1 to B6 such that the wafers W in the delivery modules TRS can be transferred between the transfer mechanisms 62 and 63 of the interface block A5 and the transfer mechanisms C1 to C6 of the unit blocks B1 to B6, respectively.

A transfer route of the wafer W in the coating/developing apparatus 72 will be described with a focus on the differences from the coating/developing apparatus 1. The wafer W received in the carrier 11 is transferred in the following order of: the transfer mechanism 13→the delivery module TRS0→the transfer mechanism 14 of the delivery block A2→the hydrophobizing module 16→the transfer mechanism 14→the delivery module TRS20 of the tower T1→the shuttle 57→the delivery module TRS10 of the tower T2→the vertical transfer mechanism 31→one of the delivery modules TRS1 to TRS3 of the tower T2, and then loaded into a respective one of the unit blocks B1 to B3.

Subsequently, the wafer W is subjected to the exposure treatment and then transferred to one of the unit blocks B4 to B6 through a respective delivery module TRS of the tower T3 of the interface block A5. In the respective one of the unit blocks B4 to B6, the wafer W is subjected to the development treatment. Thereafter, the wafer W is transferred in the following order of: one of the delivery modules TRS4 to TRS6 of the tower T2→the vertical transfer mechanism 31→the delivery module TRS31 or TRS32→the lower transfer mechanism 41 or the upper transfer mechanism 42→the rear surface cleaning module 73 positioned at a level where the lower transfer mechanism 41 or the upper transfer mechanism 42 can advance→the lower transfer mechanism 41 or the upper transfer mechanism 42→the delivery module TRS41 or TRS42→the transfer mechanism 15 of the delivery block A2→the delivery module TRS7→the transfer mechanism 13→the carrier 11. The coating/developing apparatus 72 has effects similar to those of the coating/developing apparatus 1.

While in the middle block A4 of the coating/developing apparatus 1 described in FIG. 5, the transfer areas 41A, 42A and 58 of the lower transfer mechanism 41, the upper transfer mechanism 42 and the shuttle 57 has been described to be respectively defined such that the number of modules where the wafers W are delivered by the lower transfer mechanism 41 is identical to that of modules where the wafers W are delivered by the upper transfer mechanism 42, for the same type of modules, the present disclosure is not limited thereto. In an example of the middle block A4 shown in FIG. 16, an exhaust unit 53A, a periphery exposing module 51A, heating modules 52A to 52C, an exhaust unit 53B, periphery exposing modules 51B and 51C, and heating modules 52D to 52I may be stacked one above another from below upward. Further, the transfer areas 41A, 42A, and 58 may be defined such that the lower transfer mechanism 41 transfers the wafer W to the protective film forming modules ITC1 and ITC2, the periphery exposing module 51A, and the heating modules 52A to 52C, and the upper transfer mechanism 42 transfers the wafer W to the protective film forming modules ITC3 to ITC6, the periphery exposing modules 51B and 51C, and the heating modules 52D to 52I.

However, in view of suppressing transfer loads borne by the lower transfer mechanism 41 and the upper transfer mechanism 42 from unbalancing and thus increasing throughput, it is effective to define the transfer areas 41A, 42A, and 58 such that the number of the modules where the wafers W are transferred by the lower transfer mechanism 41 and the number of the modules where the wafers W are transferred by the upper transfer mechanism 42 are identical to each other, for the same type of modules stacked as shown in FIG. 5.

Further, in some embodiments, the middle block A4 shown in FIG. 5 may include only one of the lower transfer mechanism 41 and the upper transfer mechanism 42 such that the single transfer mechanism transfers the wafer W to the protective film forming modules ITC1 to ITC6, the periphery exposing modules 51A and 51B, and the heating modules 52A to 52H, which are stacked one above another. In this case, the transfer area 58 of the wafer W by the shuttle 57 may be defined above or below a transfer area of the wafer W by the single transfer mechanism.

Moreover, the transfer area 58 of the wafer W by the shuttle 57 is not limited to be defined between the transfer area 41A of the lower transfer mechanism 41 and the transfer area 42A of the upper transfer mechanism 42. FIG. 17 is a modified example of the middle block A4 described in FIG. 1. In FIG. 17, the delivery modules TRS10 and TRS20 are disposed at positions spaced apart from the towers T2 and T3 in the left-right direction. A vertical zone formed by the stacked heating modules is defined as the transfer area 58 of the shuttle 57. The wafer W is delivered by the shuttle 57 between the delivery modules TRS10 and TRS20. The support body 34 of the vertical transfer mechanism 31 rotates around its vertical axis such that the wafer W can be delivered between the delivery module TRS10 and the respective modules of the tower T2. The delivery module TRS20 is disposed at a position where the wafer W can be delivered by the transfer mechanism 62.

In some embodiments, in the coating/developing apparatus 72 according to the fourth embodiment, the wafer W unloaded from the carrier block A1 may be delivered to the middle block A4 where the wafer W is subjected to a cleaning treatment by the rear surface cleaning module 73, and then may be directly returned to the carrier 11, without passing through a series of the blocks A3 and A5 and the exposing apparatus A6 where the wafer W is subjected to respective treatments such as the resist coating treatment, the development treatment and the like. In other words, the present disclosure may be applied as a cleaning apparatus of the wafer W. Similarly, in the coating/developing apparatus 1 of the first embodiment, the wafer W unloaded from the carrier 11 may be subjected to only the protective film forming treatment in the middle block A4 and be returned to the carrier 11, without being subjected to the resist coating treatment and the development treatment. In other words, the present disclosure may be applied as a protective film forming apparatus. A described above, the present disclosure is not limited to the coating/developing apparatus. Further, the examples described in the above embodiments may be combined with each other. As an example, the middle block A4 including the rear surface cleaning module 73 described in the fourth embodiment may be disposed between the delivery block A2 and the processing block A3 in the coating/developing apparatuses 1 and 7 of the first and second embodiments.

The substrate processing apparatus of the present disclosure is provided with a carrier block, a middle block and an end block, which are sequentially arranged. The middle block includes processing modules stacked one above another, a first substrate transfer mechanism configured to transfer a substrate to the respective processing module and transfer the substrate from the carrier block to the end block or vice versa, and a second substrate transfer mechanism configured to transfer the substrate back without passing through the respective processing module. This configuration can suppress an increase in footprint of the apparatus and increase the number of the processing modules installed in the apparatus. Further, the second substrate transfer mechanism reduces a load borne by the first substrate transfer mechanism configured to transfer the substrate to the respective processing module, thus quickly transferring the substrate to one of the carrier block and the end block, which makes it possible to improve throughput.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a carrier block configured to pick up a substrate received in a carrier;
an end block disposed in a horizontal direction with respect to the carrier block and configured to return the substrate picked up from the carrier block to the carrier block; and
a middle block disposed between the carrier block and the end block,
wherein the middle block includes:
a plurality of first processing modules stacked one above another, each of which being configured to process the substrate picked up from the carrier block and directed to the end block or the substrate returning from the end block to the carrier block;
a first substrate transfer mechanism configured to move up and down to transfer the substrate that is transferred from one of the carrier block and the end block to the middle block, to a respective one of the first processing modules, and to deliver the substrate to the other of the carrier block and the end block;
a second substrate transfer mechanism installed separately from the first substrate transfer mechanism and configured to transfer the substrate from the other of the carrier block and the end block to the one thereof, without passing through the plurality of first processing modules,
a delivery part composed of a plurality of delivery modules which are stacked in a vertical direction and configured to deliver the substrate between the first transfer mechanism and the second transfer mechanism; and
a lateral air flow forming part configured to form an air flow flowing laterally through a gap between the respective delivery modules, and including a lateral gas supply part configured to laterally supply gas toward the delivery part, and a lateral exhaust part through which gas is exhausted, the lateral gas supply part and the lateral exhaust part being installed to be inserted laterally into the delivery part, wherein the lateral exhaust part includes a guide disposed in a vertical transfer mechanism of the first substrate transfer mechanism and configured to move up and down a support body by which the substrate is supported.

2. The substrate processing apparatus of claim 1, wherein a processing block is disposed between the carrier block and the end block, and one of the middle block and the processing block is disposed to face the carrier block, and the other is disposed to face the end block,
wherein the processing block includes a plurality of unit blocks which is vertically partitioned from each other and is provided with a third substrate transfer mechanism configured to transfer the substrate between the carrier block and the end block,
wherein each of the plurality of unit blocks includes a second processing module configured to process a substrate before or after being processed by each of the plurality of first processing modules, which is transferred by the third substrate transfer mechanism, and
wherein the delivery part is further configured to deliver the substrate between the first transfer mechanism, the second transfer mechanism, and the third transfer mechanism.

3. The substrate processing apparatus of claim 2, wherein the plurality of delivery modules of the delivery part includes:
a plurality of first mounting modules on each of which the substrate is mounted and through each of which the substrate is delivered with respect to the third substrate transfer mechanism, the plurality of first mounting modules being disposed corresponding to the plurality of unit blocks; and
a second mounting module on which the substrate is mounted and through which the substrate is delivered with respect to the second substrate transfer mechanism, and
wherein the vertical transfer mechanism is further configured to transfer the substrate between the plurality of first mounting modules and the second mounting module.

4. The substrate processing apparatus of claim 3, wherein the plurality of delivery modules of the delivery part is configured by arranging the plurality of first mounting modules and the second mounting module in a vertical direction.

5. The substrate processing apparatus of claim 1, wherein a substrate transfer area of the second substrate transfer mechanism and a substrate transfer area of the first substrate transfer mechanism are defined to be overlapped with each other in a vertical direction.

6. The substrate processing apparatus of claim 5, wherein the first substrate transfer mechanism includes:
an upper transfer mechanism configured to transfer the substrate inside an upper transfer area over which the substrate is delivered with respect to upper modules of the plurality of first processing modules in the middle block, and a lower transfer mechanism configured to transfer the substrate inside a lower transfer area over which the substrate is delivered with respect to lower modules of the plurality of first processing modules in the middle block, the lower transfer area being vertically overlapped with the upper transfer area,
wherein the substrate transfer area of the second substrate transfer mechanism is defined between the upper transfer area and the lower transfer area.

7. The substrate processing apparatus of claim 6, further comprising: a descending air flow forming part configured to form a descending air flow in each of the upper transfer area and the lower transfer area,
    wherein the descending air flow forming part includes:
    a gas supply part configured to supply gas to each of the upper transfer area and the lower transfer area from top; and
    an exhaust port configured to exhaust the gas through a lateral side of a lower portion of each of the upper transfer area and the lower transfer area.

8. The substrate processing apparatus of claim 2, wherein the second processing module includes a resist film forming module in which a resist film is formed on the substrate,
    wherein the middle block or the processing block includes a developing module configured to develop the resist film exposed by an exposing apparatus, and
    wherein the end block is an interface block configured to deliver the substrate between the middle block or the processing block and the exposing apparatus.

9. The substrate processing apparatus of claim 8, wherein the processing block is disposed to face the carrier block, and the middle block is disposed to face the end block,
    wherein, among the plurality of unit blocks, a first unit block is provided with the resist film forming module as the second processing module, and a second unit block different from the first unit block is provided with the developing module as the first processing module,
    wherein the first processing module is a module configured to perform a liquid treatment on the substrate having the resist film formed thereon, before being subjected to an exposure treatment,
    wherein the first substrate transfer mechanism transfers the substrate, which is transferred from the first unit block to the delivery part, to the first processing module, followed by delivering to the substrate to the end block, and
    wherein the second substrate transfer mechanism transfers the substrate from the end block to the delivery part such that the substrate is delivered to the carrier block through the second unit block.

10. The substrate processing apparatus of claim 8, wherein the processing block is disposed to face the carrier block side, and the middle block is disposed to face the end block side,
    wherein, among the plurality of unit blocks, a first unit block is provided with the resist film forming module as the second processing module,
    wherein the first processing module is the developing module,
    wherein the second substrate transfer mechanism transfers the substrate to the end block,
    wherein the first substrate transfer mechanism transfers the substrate, which is transferred from the end block to the middle block, to the first processing module, followed by transferring the substrate to the delivery part, and
    wherein the first transfer mechanism of a second unit block different from the first unit block transfers the substrate from the delivery part to the carrier block.

11. A method for use in a substrate processing apparatus, the substrate processing apparatus including:
    a carrier block configured to pick up a substrate received in a carrier;
    an end block disposed in a horizontal direction with respect to the carrier block and configured to return the substrate picked up from the carrier block to the carrier block; and
    a middle block disposed between the carrier block and the end block, the middle block including a delivery part and a lateral air flow forming part configured to form an air flow flowing laterally,
    the method comprising:
    processing, by a plurality of processing modules stacked one above another and disposed in the middle block, the substrate picked up from the carrier block and directed to the end block or the substrate returning from the end block to the carrier block;
    delivering, by a first substrate transfer mechanism configured to move up and down and disposed in the middle block, the substrate that is transferred from one of the carrier block and the end block to the middle block, to a respective one of the processing modules, and delivering the substrate to the other of the carrier block and the end block; and
    transferring, by a second substrate transfer mechanism installed separately from the first substrate transfer mechanism and disposed in the middle block, the substrate from the other of the carrier block and the end block to the one, without passing through the plurality of processing modules,
    wherein while delivering and transferring the substrate, the substrate is delivered via the delivery part, and a supply operation of a clean air by the lateral air flow forming part and an exhaust operation by the lateral air flow forming part are performed in parallel.

12. A non-transitory computer-readable storage medium storing a computer program used in a substrate processing apparatus,
    wherein the computer program causes a computer to execute the substrate processing method of claim 11.

* * * * *